(12) United States Patent
Ghantous et al.

(10) Patent No.: US 12,132,339 B2
(45) Date of Patent: *Oct. 29, 2024

(54) BATTERY ADAPTIVE CHARGING USING A BATTERY MODEL

(71) Applicant: Qnovo Inc., Milpitas, CA (US)

(72) Inventors: Dania Ghantous, Walnut Creek, CA (US); Fred Berkowitz, Los Gatos, CA (US); Nadim Maluf, Los Altos, CA (US)

(73) Assignee: Qnovo Inc., Newark, CA (US)

( * ) Notice: Subject to any disclaimer, the term of this patent is extended or adjusted under 35 U.S.C. 154(b) by 160 days.

This patent is subject to a terminal disclaimer.

(21) Appl. No.: 17/808,496

(22) Filed: Jun. 23, 2022

(65) Prior Publication Data
US 2022/0317199 A1    Oct. 6, 2022

Related U.S. Application Data

(63) Continuation of application No. 16/183,559, filed on Nov. 7, 2018, now Pat. No. 11,397,216, which is a
(Continued)

(51) Int. Cl.
*H02J 7/00* (2006.01)
*G01R 31/392* (2019.01)
(Continued)

(52) U.S. Cl.
CPC .......... *H02J 7/0048* (2020.01); *G01R 31/392* (2019.01); *H02J 7/0047* (2013.01);
(Continued)

(58) Field of Classification Search
CPC ...... H02J 7/0048; H02J 7/00711; H02J 7/005; H02J 7/007182; H02J 7/0047; G01R 31/3835
(Continued)

(56) References Cited

U.S. PATENT DOCUMENTS

| 4,388,582 A | 6/1983 | Saar et al. |
| 4,680,241 A | 7/1987 | Dyer |

(Continued)

FOREIGN PATENT DOCUMENTS

| CN | 1985183 A | 6/2007 |
| CN | 102577009 A | 7/2012 |

(Continued)

OTHER PUBLICATIONS

Chinese First Office Action, dated Aug. 1, 2014, issued in CN 201180025100.4.
(Continued)

*Primary Examiner* — Alexis B Pacheco
(74) *Attorney, Agent, or Firm* — Weaver Austin Villeneuve & Sampson LLP

(57) ABSTRACT

Batteries and associated charging conditions or other operating conditions are evaluated by a computational model that classifies or characterizes the battery and associated conditions. Such battery model may classify batteries according to any of many different considerations such as whether the conditions are safe or unsafe or whether the conditions are likely to unnecessarily degrade the future performance of the battery. In some cases, the battery model executes while the battery is installed in an electronic device such as a smart phone or a vehicle. In some cases, the battery model executes and provides results (e.g., a classification of the battery) in real time while the battery is installed and being charged.

30 Claims, 15 Drawing Sheets

Related U.S. Application Data continuation-in-part of application No. 16/107,560, filed on Aug. 21, 2018, now abandoned, which is a continuation of application No. 14/752,592, filed on Jun. 26, 2015, now Pat. No. 10,067,198, which is a continuation of application No. 14/003,826, filed as application No. PCT/US2012/030618 on Mar. 26, 2012, now Pat. No. 9,121,910, and a continuation-in-part of application No. 13/366,352, filed on Feb. 5, 2012, now Pat. No. 8,970,178, and a continuation-in-part of application No. 13/167,782, filed on Jun. 24, 2011, now Pat. No. 8,791,669, and a continuation-in-part of application No. 13/111,902, filed on May 19, 2011, now Pat. No. 8,638,070.

(60) Provisional application No. 61/468,051, filed on Mar. 27, 2011, provisional application No. 61/439,400, filed on Feb. 4, 2011, provisional application No. 61/368,158, filed on Jul. 27, 2010, provisional application No. 61/358,384, filed on Jun. 24, 2010, provisional application No. 61/346,953, filed on May 21, 2010.

(51) Int. Cl.
  *H02J 7/14* (2006.01)
  *G01R 31/3835* (2019.01)
  *H01M 10/44* (2006.01)
  *H01M 10/48* (2006.01)

(52) U.S. Cl.
  CPC ........... *H02J 7/005* (2020.01); *H02J 7/00711* (2020.01); *H02J 7/007182* (2020.01); *G01R 31/3835* (2019.01); *H01M 10/44* (2013.01); *H01M 10/48* (2013.01); *H02J 7/00* (2013.01); *H02J 7/007* (2013.01)

(58) Field of Classification Search
  USPC ........................................................ 320/109
  See application file for complete search history.

(56) References Cited

U.S. PATENT DOCUMENTS

| | | | |
|---|---|---|---|
| 4,829,225 | A | 5/1989 | Podrazhansky et al. |
| 5,410,238 | A | 4/1995 | Ishizuka et al. |
| 5,442,274 | A | 8/1995 | Tamai |
| 5,500,583 | A | 3/1996 | Buckley et al. |
| 5,684,386 | A | 11/1997 | Okada |
| 5,747,969 | A | 5/1998 | Tamai |
| 5,767,661 | A | 6/1998 | Williams |
| 5,773,955 | A * | 6/1998 | Hall ................. H02J 7/00711 320/108 |
| 5,808,367 | A | 9/1998 | Akagi et al. |
| 5,808,447 | A | 9/1998 | Hagino |
| 5,888,665 | A | 3/1999 | Bugga et al. |
| 5,900,718 | A | 5/1999 | Tsenter |
| 5,905,364 | A | 5/1999 | Ookita |
| 5,923,149 | A | 7/1999 | Umetsu |
| 5,945,811 | A | 8/1999 | Hasegawa et al. |
| 5,982,152 | A | 11/1999 | Watanabe et al. |
| 5,994,875 | A | 11/1999 | Lee |
| 6,040,685 | A | 3/2000 | Tsenter et al. |
| 6,043,631 | A | 3/2000 | Tsenter |
| 6,074,771 | A | 6/2000 | Cubukcu et al. |
| 6,094,033 | A | 7/2000 | Ding et al. |
| 6,097,172 | A | 8/2000 | Podrazhansky et al. |
| 6,127,804 | A | 10/2000 | Oglesbee et al. |
| 6,127,809 | A | 10/2000 | Kates et al. |
| 6,137,265 | A * | 10/2000 | Cummings ......... H02J 7/00711 320/133 |
| 6,144,187 | A | 11/2000 | Bryson |
| 6,154,011 | A | 11/2000 | Lam et al. |
| 6,194,867 | B1 | 2/2001 | Cummings et al. |
| 6,204,634 | B1 * | 3/2001 | Zimmerman ........ H02J 7/0069 320/128 |
| 6,215,281 | B1 | 4/2001 | Koch |
| 6,259,231 | B1 | 7/2001 | Hansen |
| 6,262,577 | B1 | 7/2001 | Nakao et al. |
| 6,275,009 | B1 | 8/2001 | Sakakibara et al. |
| 6,307,353 | B1 | 10/2001 | Shiojima |
| 6,313,605 | B1 | 11/2001 | Tsenter |
| 6,362,598 | B2 | 3/2002 | Laig-Horstebrock et al. |
| 6,366,056 | B1 | 4/2002 | Podrazhansky et al. |
| 6,377,028 | B1 | 4/2002 | Armstrong, II et al. |
| 6,441,585 | B1 | 8/2002 | Bertness |
| 6,441,586 | B1 | 8/2002 | Tate, Jr. et al. |
| 6,456,988 | B1 | 9/2002 | Singh et al. |
| 6,469,471 | B1 | 10/2002 | Anbuky et al. |
| 6,532,425 | B1 | 3/2003 | Boost et al. |
| 6,630,814 | B2 | 10/2003 | Ptasinski et al. |
| 6,631,293 | B2 | 10/2003 | Lyden |
| 6,646,419 | B1 | 11/2003 | Ying |
| 6,707,272 | B1 | 3/2004 | Thandiwe |
| 6,789,026 | B2 | 9/2004 | Barsoukov et al. |
| 6,832,171 | B2 | 12/2004 | Barsoukov et al. |
| 6,833,686 | B2 | 12/2004 | Veselic et al. |
| 6,841,974 | B2 | 1/2005 | Dykeman |
| 6,892,148 | B2 | 5/2005 | Barsoukov et al. |
| 6,924,622 | B1 | 8/2005 | Anbuky et al. |
| 7,005,830 | B2 | 2/2006 | Moore et al. |
| 7,034,503 | B2 | 4/2006 | Veselic et al. |
| 7,072,871 | B1 | 7/2006 | Tinnemeyer |
| 7,180,298 | B2 | 2/2007 | Nakamura et al. |
| 7,199,557 | B2 | 4/2007 | Anbuky et al. |
| 7,205,748 | B2 | 4/2007 | Nishida et al. |
| 7,227,336 | B1 | 6/2007 | Van et al. |
| 7,245,107 | B2 | 7/2007 | Moore et al. |
| 7,248,023 | B2 | 7/2007 | Takezawa et al. |
| 7,324,902 | B2 | 1/2008 | Verbrugge et al. |
| 7,362,074 | B2 | 4/2008 | Iwane et al. |
| 7,402,980 | B2 | 7/2008 | Al-Anbuky et al. |
| 7,405,538 | B1 | 7/2008 | Hoff et al. |
| 7,492,130 | B2 | 2/2009 | Daboussi |
| 7,557,541 | B2 | 7/2009 | Marinka-Toth et al. |
| 7,570,015 | B2 | 8/2009 | Bansal et al. |
| 7,595,611 | B2 | 9/2009 | Reynier et al. |
| 7,626,394 | B2 | 12/2009 | Kimura et al. |
| 7,737,665 | B2 | 6/2010 | Grewe et al. |
| 7,772,804 | B2 | 8/2010 | Bhardwaj et al. |
| 7,788,052 | B2 | 8/2010 | Iwane et al. |
| 8,036,839 | B2 | 10/2011 | Machiyama et al. |
| 8,040,106 | B2 | 10/2011 | Ishikawa |
| 8,044,635 | B2 | 10/2011 | Peterson |
| 8,159,183 | B2 | 4/2012 | Choi et al. |
| 8,244,177 | B2 | 8/2012 | Zyambo et al. |
| 8,350,531 | B2 | 1/2013 | Morimoto et al. |
| 8,368,357 | B2 | 2/2013 | Ghantous et al. |
| 8,427,112 | B2 | 4/2013 | Ghantous et al. |
| 8,513,921 | B2 | 8/2013 | Berkowitz et al. |
| 8,531,158 | B2 | 9/2013 | Wang et al. |
| 8,638,070 | B2 | 1/2014 | Maluf et al. |
| 8,791,669 | B2 | 7/2014 | Ghantous et al. |
| 8,907,631 | B1 * | 12/2014 | Gurries ................. G01K 13/00 320/141 |
| 8,963,494 | B2 | 2/2015 | Kishiyama et al. |
| 8,970,178 | B2 | 3/2015 | Berkowitz et al. |
| 8,975,874 | B2 | 3/2015 | Berkowitz et al. |
| 9,035,621 | B2 | 5/2015 | Berkowitz et al. |
| 9,035,623 | B1 | 5/2015 | Berkowitz et al. |
| 9,063,018 | B1 | 6/2015 | Ghantous et al. |
| 9,121,910 | B2 | 9/2015 | Maluf et al. |
| 9,142,994 | B2 | 9/2015 | Berkowitz et al. |
| 9,263,900 | B2 | 2/2016 | Ju et al. |
| 9,270,134 | B2 | 2/2016 | Gaddam et al. |
| 9,373,972 | B2 | 6/2016 | Ghantous et al. |
| 9,385,555 | B2 | 7/2016 | Ghantous et al. |
| 9,461,492 | B1 | 10/2016 | Berkowitz et al. |
| 9,702,940 | B2 | 7/2017 | Maluf et al. |
| 9,726,554 | B1 | 8/2017 | Ghantous et al. |
| 9,787,122 | B2 | 10/2017 | Berkowitz et al. |
| 9,791,513 | B2 | 10/2017 | Maluf et al. |

(56) References Cited

U.S. PATENT DOCUMENTS

| | | |
|---|---|---|
| 9,912,181 B2 | 3/2018 | Gurries et al. |
| 10,067,198 B2 | 9/2018 | Maluf et al. |
| 10,128,678 B2 | 11/2018 | Berkowitz et al. |
| 10,291,048 B2 | 5/2019 | Tkachenko et al. |
| 10,389,156 B2 | 8/2019 | Berkowitz et al. |
| 10,447,055 B1 | 10/2019 | Berkowitz et al. |
| 10,574,079 B1 | 2/2020 | Berkowitz et al. |
| 11,063,459 B2 | 7/2021 | Berkowitz et al. |
| 11,397,215 B2 | 7/2022 | Ghantous et al. |
| 11,397,216 B2 | 7/2022 | Ghantous et al. |
| 11,728,525 B2 | 8/2023 | Ghantous et al. |
| 11,791,647 B2 | 10/2023 | Berkowitz et al. |
| 2001/0000212 A1 | 4/2001 | Reipur et al. |
| 2001/0001533 A1 | 5/2001 | Stuck Andersen et al. |
| 2001/0011881 A1 | 8/2001 | Emori et al. |
| 2001/0017243 A1 | 8/2001 | Tajima et al. |
| 2002/0000788 A1 | 1/2002 | Ostergaard et al. |
| 2002/0001745 A1 | 1/2002 | Gartstein et al. |
| 2002/0070706 A1 | 6/2002 | Champlin |
| 2002/0075003 A1* | 6/2002 | Fridman ................ H02J 7/005 324/426 |
| 2002/0109504 A1 | 8/2002 | Champlin |
| 2002/0117997 A1 | 8/2002 | Feil et al. |
| 2003/0003363 A1 | 1/2003 | Daido et al. |
| 2003/0206021 A1 | 11/2003 | Laletin et al. |
| 2004/0032237 A1 | 2/2004 | Dykeman |
| 2004/0038087 A1 | 2/2004 | Shiue et al. |
| 2005/0083017 A1 | 4/2005 | Suzuki |
| 2005/0156577 A1 | 7/2005 | Sully |
| 2005/0189948 A1 | 9/2005 | Koch |
| 2005/0194938 A1 | 9/2005 | Sanpei |
| 2005/0214646 A1 | 9/2005 | Kubota |
| 2005/0248314 A1 | 11/2005 | James |
| 2005/0264263 A1 | 12/2005 | Tsenter |
| 2006/0001406 A1 | 1/2006 | Matan |
| 2006/0066285 A1 | 3/2006 | Minamiura |
| 2006/0093894 A1 | 5/2006 | Scott et al. |
| 2006/0145658 A1 | 7/2006 | Wang |
| 2006/0181245 A1 | 8/2006 | Mizuno et al. |
| 2006/0186890 A1 | 8/2006 | Iwane et al. |
| 2006/0208701 A1 | 9/2006 | Mikhaylik |
| 2006/0238168 A1 | 10/2006 | Matsuo et al. |
| 2007/0132456 A1 | 6/2007 | Salman et al. |
| 2007/0170890 A1 | 7/2007 | Fee et al. |
| 2007/0194756 A1 | 8/2007 | Cutrona |
| 2007/0216359 A1 | 9/2007 | Arai et al. |
| 2007/0229034 A1 | 10/2007 | Tatebayashi et al. |
| 2007/0236225 A1 | 10/2007 | Tsenter et al. |
| 2007/0257681 A1 | 11/2007 | Christophersen et al. |
| 2008/0003490 A1 | 1/2008 | Christensen et al. |
| 2008/0079396 A1 | 4/2008 | Yamazaki et al. |
| 2008/0079397 A1 | 4/2008 | Fee et al. |
| 2008/0211459 A1 | 9/2008 | Choi |
| 2008/0238361 A1* | 10/2008 | Pinnell ..................... H02J 7/04 320/162 |
| 2009/0027006 A1 | 1/2009 | Vezzini et al. |
| 2009/0027007 A1 | 1/2009 | Iwane et al. |
| 2009/0027056 A1 | 1/2009 | Huang et al. |
| 2009/0146664 A1 | 6/2009 | Zhang |
| 2009/0195214 A1 | 8/2009 | Gehrke et al. |
| 2009/0212626 A1 | 8/2009 | Snyder et al. |
| 2009/0256528 A1 | 10/2009 | Greening et al. |
| 2009/0259420 A1 | 10/2009 | Greening et al. |
| 2009/0273320 A1 | 11/2009 | Ungar et al. |
| 2009/0295337 A1 | 12/2009 | Ishikawa |
| 2009/0325056 A1 | 12/2009 | Greening et al. |
| 2009/0326842 A1 | 12/2009 | Thomas-Alyea |
| 2010/0000809 A1 | 1/2010 | Nishi et al. |
| 2010/0039116 A1 | 2/2010 | Tsenter et al. |
| 2010/0060240 A1 | 3/2010 | Karoui et al. |
| 2010/0066310 A1 | 3/2010 | Biggs, Jr. |
| 2010/0072951 A1 | 3/2010 | Nakashima |
| 2010/0072955 A1 | 3/2010 | Ishikawa |
| 2010/0085022 A1 | 4/2010 | Shimizu et al. |
| 2010/0109443 A1 | 5/2010 | Cook et al. |
| 2010/0134305 A1 | 6/2010 | Lu et al. |
| 2010/0164437 A1 | 7/2010 | McKinley et al. |
| 2010/0213901 A1 | 8/2010 | Morimoto et al. |
| 2010/0219795 A1 | 9/2010 | Morimoto et al. |
| 2010/0253285 A1 | 10/2010 | Takahashi et al. |
| 2011/0037439 A1 | 2/2011 | Bhardwaj et al. |
| 2011/0089907 A1 | 4/2011 | Bhardwaj et al. |
| 2011/0190852 A1 | 8/2011 | Dinsmoor et al. |
| 2011/0254377 A1 | 10/2011 | Wildmer et al. |
| 2011/0285356 A1 | 11/2011 | Maluf et al. |
| 2011/0316548 A1 | 12/2011 | Ghantous et al. |
| 2012/0025756 A1 | 2/2012 | Xu et al. |
| 2012/0032648 A1 | 2/2012 | Ghantous et al. |
| 2012/0038325 A1 | 2/2012 | Morita et al. |
| 2012/0200266 A1 | 8/2012 | Berkowitz et al. |
| 2012/0203483 A1 | 8/2012 | Ghantous et al. |
| 2012/0235636 A1 | 9/2012 | Partovi |
| 2012/0242285 A1 | 9/2012 | Jung et al. |
| 2012/0280650 A1 | 11/2012 | Kim et al. |
| 2012/0310565 A1 | 12/2012 | Redey |
| 2013/0026976 A1 | 1/2013 | Lu |
| 2013/0062966 A1 | 3/2013 | Verghese et al. |
| 2013/0083722 A1 | 4/2013 | Bhargava et al. |
| 2013/0119921 A1 | 5/2013 | Choe et al. |
| 2013/0154548 A1 | 6/2013 | Berkowitz et al. |
| 2013/0193914 A1 | 8/2013 | Gaddam et al. |
| 2014/0021959 A1 | 1/2014 | Maluf et al. |
| 2014/0079969 A1 | 3/2014 | Greening et al. |
| 2014/0084846 A1 | 3/2014 | Berkowitz et al. |
| 2014/0139192 A1 | 5/2014 | Berkowitz et al. |
| 2014/0183970 A1 | 7/2014 | Kurihara et al. |
| 2014/0247004 A1 | 9/2014 | Kari et al. |
| 2014/0266068 A1 | 9/2014 | O'Brien et al. |
| 2014/0312912 A1 | 10/2014 | Berkowitz et al. |
| 2015/0091496 A1 | 4/2015 | Meunier et al. |
| 2015/0137741 A1 | 5/2015 | Gurries et al. |
| 2015/0153417 A1 | 6/2015 | Maluf et al. |
| 2015/0155734 A1 | 6/2015 | Ghantous et al. |
| 2015/0219722 A1 | 8/2015 | Maluf et al. |
| 2015/0357841 A1 | 12/2015 | Berkowitz et al. |
| 2015/0377976 A1 | 12/2015 | Maluf et al. |
| 2015/0380957 A1 | 12/2015 | Ghantous et al. |
| 2016/0028268 A1 | 1/2016 | Fisher-Jeffes et al. |
| 2016/0106370 A1 | 4/2016 | Filipovic et al. |
| 2016/0116548 A1 | 4/2016 | Ghantous et al. |
| 2016/0359339 A1 | 12/2016 | Hwang et al. |
| 2017/0302088 A1 | 10/2017 | Tkachenko et al. |
| 2017/0338667 A1 | 11/2017 | Loonen et al. |
| 2017/0346305 A1 | 11/2017 | Berkowitz et al. |
| 2018/0031642 A1 | 2/2018 | Sung |
| 2018/0090947 A1 | 3/2018 | Berkowitz et al. |
| 2019/0072618 A1* | 3/2019 | Ghantous ................ H02J 7/005 |
| 2019/0120910 A1 | 4/2019 | Ghantous et al. |
| 2019/0248252 A1 | 8/2019 | Jin |
| 2020/0106275 A1 | 4/2020 | Berkowitz et al. |
| 2021/0148987 A1 | 5/2021 | Ghantous et al. |
| 2021/0296908 A1 | 9/2021 | Berkowitz et al. |
| 2021/0328448 A1 | 10/2021 | Konopka et al. |
| 2021/0367442 A1 | 11/2021 | Konopka et al. |
| 2022/0029443 A1 | 1/2022 | Konopka et al. |
| 2022/0317198 A1 | 10/2022 | Ghantous et al. |
| 2022/0341999 A1 | 10/2022 | Konopka et al. |
| 2023/0006271 A1 | 1/2023 | Ghantous et al. |
| 2023/0170716 A1 | 6/2023 | Berkowitz et al. |
| 2023/0305070 A1 | 9/2023 | Campbell et al. |
| 2023/0335810 A1 | 10/2023 | Ghantous et al. |
| 2023/0411982 A1 | 12/2023 | Berkowitz et al. |

FOREIGN PATENT DOCUMENTS

| | | |
|---|---|---|
| CN | 102906961 B | 1/2016 |
| CN | 103683385 B | 7/2017 |
| EP | 1191622 A1 | 3/2002 |
| KR | 101802000 B1 | 11/2017 |
| KR | 102118218 B1 | 6/2020 |
| WO | WO-0013288 A1 | 3/2000 |
| WO | WO-0075678 A1 | 12/2000 |
| WO | WO-0221149 A2 | 3/2002 |
| WO | WO-0221662 A2 | 3/2002 |

(56) References Cited

FOREIGN PATENT DOCUMENTS

| | | |
|---|---|---|
| WO | WO-0241466 A2 | 5/2002 |
| WO | WO-02093712 A2 | 11/2002 |
| WO | WO-03107505 A2 | 12/2003 |
| WO | WO-2004017485 A1 | 2/2004 |
| WO | WO-2004109311 A1 | 12/2004 |
| WO | WO-2005003800 A1 | 1/2005 |
| WO | WO-2005101042 A1 | 10/2005 |
| WO | WO-2005114808 A2 | 12/2005 |
| WO | WO-2006057468 A1 | 6/2006 |
| WO | WO-2007004098 A1 | 1/2007 |
| WO | WO-2008117239 A2 | 10/2008 |
| WO | WO-2008128429 A1 | 10/2008 |
| WO | WO-2009025944 A2 | 2/2009 |
| WO | WO-2009126734 A1 | 10/2009 |
| WO | WO-2009126797 A1 | 10/2009 |
| WO | WO-2010096180 A2 | 8/2010 |
| WO | WO-2011146783 A1 | 11/2011 |
| WO | WO-2012135148 A1 | 10/2012 |
| WO | WO-2020097271 A1 | 5/2020 |

OTHER PUBLICATIONS

Chinese First Office Action, dated Oct. 17, 2016, issued in CN 201310450976.4.
Chinese Notice of Allowance and Search Report, dated Jun. 19, 2017, issued in CN 201310450976.4.
Chinese Second Office Action, dated Apr. 16, 2015, issued in CN 201180025100.4.
Gamry Instruments, [webpage] "Basics of Electrochemical Impedance Spectroscopy" Application Notes, pp. 1-28. [retrieved on Feb. 20, 2019] URL:https://www.gamry.com/application-notes/EIS/basics-of-electrochemical-impedance-spectroscopy/.
Korean First Office Action, dated Nov. 11, 2019, issued in KR 10-2013-0113445.
Korean Office Action dated Mar. 22, 2017 issued in KR 10-2012-7033330.
Ning et al. (2006) "A Generalized Cycle Life Model of Rechargeable Lithium-Ion Batteries," Electrochimica Acta, 51:2012-2022.
Ning et al.(2004) Cycle Life Modeling of Lithium-ion Batteries, J. of Electrochemical Soc., 151(10):A1584-A1591.
Notice of Allowance dated Apr. 30, 2018 issued in U.S. Appl. No. 14/752,592.
PCT International Preliminary Report on Patentability and Written Opinion, dated Oct. 10, 2013, issued in PCT/US2012/030618.
PCT International Preliminary Report on Patentability, dated Dec. 6, 2012, issued in PCT/US2011/037255.
PCT International Preliminary Report on Patentability dated May 20, 2021 issued in PCT/US2019/060162.
PCT International Search Report and the Written Opinion, dated Mar. 20, 2020, issued in PCT/US19/60162.
PCT International Search Report and Written Opinion, dated Jul. 13, 2012, issued in PCT/US2012/030618.
PCT International Search Report and Written Opinion, dated Jul. 26, 2011, issued in PCT/US2011/037255.
Persson et al. (2010) "Lithium Diffusion in Graphitic Carbon," J. Phys. Chem. Letters, 1:1176-1180.
Piao et al. (1999) "Intercalation of Lithium Ions into Graphite Electrodes Studied by AC Impedance Measurements," J. of Electrochemical Soc., 146(8):2794-2798.
Purushothaman et al., (2005) Reduced Mass Transport Limitations by Application of Special Pulse Current modes, J. of Electrochemical Soc., 152(4):J33-J39.
Purushothaman et al., (2006) "Rapid Charging of Lithium-Ion Batteries using Pulsed Currents," J. of Electrochemical Soc., 153(3):A533-A542.
Santhanagopalan et al., (2006) "Online estimation of the state of charge of a lithium ion cell," Journal of Power Sources, Elsevier, B.V. 161:1346-1355.
U.S. Supplementry Notice of Allowance dated Jun. 27, 2022 in U.S. Appl. No. 16/183,559.
U.S. Appl. No. 16/107,560, inventors Maluf et al., filed on Aug. 21, 2018.
U.S. Final Office Action dated Dec. 20, 2018 issued in U.S. Appl. No. 15/730,670.
US Final Office Action dated Dec. 30, 2014 issued in U.S. Appl. No. 14/252,422.
US Final Office Action dated Jan. 7, 2019 issued in U.S. Appl. No. 15/234,995.
US Final Office Action dated Jan. 8, 2018 issued in U.S. Appl. No. 14/752,592.
US Final Office Action dated Mar. 8, 2019 issued in U.S. Appl. No. 14/743,769.
U.S. Final Office Action dated Nov. 13, 2020 issued in U.S. Appl. No. 16/459,824.
US Final Office Action dated Nov. 30, 2017 issued in U.S. Appl. No. 14/743,769.
US Final Office Action dated Nov. 7, 2012 issued in U.S. Appl. No. 13/271,340.
US Final Office Action dated Nov. 8, 2013 issued in U.S. Appl. No. 13/747,914.
U.S. Notice of Allowance dated Jun. 29, 2022 in U.S. Appl. No. 16/183,550.
US Notice of Allowance (Corrected Notice of Allowability) dated Aug. 29, 2016 issued in U.S. Appl. No. 14/252,422.
US Notice of Allowance [Corrected Notice of Allowability] dated Jan. 22, 2015 issued in U.S. Appl. No. 14/161,755.
US Notice of Allowance dated Apr. 4, 2017 issued in U.S. Appl. No. 14/712,068.
US Notice of Allowance dated Feb. 21, 2017 issued in U.S. Appl. No. 14/615,486.
US Notice of Allowance dated Jan. 21, 2015 issued in U.S. Appl. No. 13/747,914.
US Notice of Allowance dated Jan. 25, 2013 issued in U.S. Appl. No. 13/271,340.
US Notice of Allowance dated Jan. 9, 2015 issued in U.S. Appl. No. 14/322,863.
US Notice of Allowance dated Jul. 12, 2019 issued in U.S. Appl. No. 14/743,769.
US Notice of Allowance dated Jun. 14, 2019 issued in U.S. Appl. No. 15/234,995.
US Notice of Allowance dated Jun. 24, 2016 issued in U.S. Appl. No. 14/252,422.
U.S. Notice of Allowance dated Jun. 8, 2017 issued in U.S. Appl. No. 14/684,371.
US Notice of Allowance dated Mar. 1, 2016 issued in U.S. Appl. No. 14/615,491.
US Notice of Allowance dated Mar. 21, 2016 issued in U.S. Appl. No. 14/851,921.
U.S. Notice of Allowance dated Mar. 21, 2022, in U.S. Appl. No. 16/183,559.
U.S. Notice of Allowance dated Mar. 25, 2022 in U.S. Appl. No. 16/183,550.
US Notice of Allowance dated Mar. 27, 2014 issued in U.S. Appl. No. 13/167,782.
US Notice of Allowance dated Mar. 27, 2015 issued in U.S. Appl. No. 14/003,826.
US Notice of Allowance dated Mar. 3, 2015 issued in U.S. Appl. No. 13/657,841.
U.S. Notice of Allowance dated Mar. 9, 2021 issued in U.S. Appl. No. 16/459,824.
US Notice of Allowance dated May 14, 2013 issued in U.S. Appl. No. 13/767,839.
U.S. Notice of Allowance dated May 17, 2017 issued in U.S. Appl. No. 14/828,235.
US Notice of Allowance dated May 20, 2015 issued in U.S. Appl. No. 13/626,605.
U.S. Notice of Allowance dated May 23, 2019 issued in U.S. Appl. No. 15/730,670.
US Notice of Allowance dated May 31, 2016 issued in U.S. Appl. No. 14/615,491.
US Notice of Allowance dated Nov. 10, 2014 issued in U.S. Appl. No. 14/161,755.

(56) References Cited

OTHER PUBLICATIONS

US Notice of Allowance dated Oct. 23, 2014 issued in U.S. Appl. No. 13/366,352.
US Notice of Allowance dated Oct. 5, 2012 issued in U.S. Appl. No. 13/271,910.
US Notice of Allowance dated Sep. 12, 2013 issued in U.S. Appl. No. 13/111,902.
U.S. Notice of Allowance dated Sep. 27, 2018 issued in U.S. Appl. No. 15/681,071.
US Notice of Allowance [Supplemental Notice of Allowability] dated Apr. 18, 2017 issued in U.S. Appl. No. 14/615,486.
U.S. Notice of Allowance [Supplemental Notice of Allowability] dated Jul. 3, 2017 issued in U.S. Appl. No. 14/684,371.
US Notice of Allowance [Supplemental Notice of Allowability] dated Jun. 1, 2016 issued in U.S. Appl. No. 14/851,921.
U.S. Notice of Allowance [Supplemental Notice of Allowability] dated Sep. 21, 2017 issued in U.S. Appl. No. 14/684,371.
US Office Action dated Apr. 24, 2013 issued in U.S. Appl. No. 13/767,839.
U.S. Office Action dated Apr. 25, 2018 issued in U.S. Appl. No. 15/681,071.
US Office Action dated Apr. 5, 2017 issued in U.S. Appl. No. 14/743,769.
U.S. Office Action dated Aug. 17, 2017 issued in U.S. Appl. No. 14/752,592.
US Office Action dated Aug. 27, 2015 issued in U.S. Appl. No. 14/252,422.
US Office Action dated Dec. 31, 2015 issued in U.S. Appl. No. 14/615,491.
US Office Action dated Dec. 31, 2015 issued in U.S. Appl. No. 14/851,921.
US Office Action dated Dec. 9, 2014 issued in U.S. Appl. No. 13/626,605.
US Office Action dated Feb. 1, 2017 issued in U.S. Appl. No. 14/828,235.
US Office Action dated Jul. 2, 2018 issued in U.S. Appl. No. 14/743,769.
US Office Action dated Jul. 3, 2014 issued in U.S. Appl. No. 14/252,422.
U.S. Office Action dated Jun. 15, 2020 issued in U.S. Appl. No. 16/459,824.
US Office Action dated Jun. 18, 2013 issued in U.S. Appl. No. 13/111,902.
US Office Action dated Jun. 19, 2013 issued in U.S. Appl. No. 13/747,914.
US Office Action dated Jun. 26, 2012 issued in U.S. Appl. No. 13/271,340.
US Office Action dated Mar. 28, 2012 issued in U.S. Appl. No. 13/271,910.
U.S. Office Action dated May 16, 2018 issued in U.S. Appl. No. 15/730,670.
US Office Action dated May 17, 2016 issued in U.S. Appl. No. 14/615,486.
US Office Action dated May 17, 2018 issued in U.S. Appl. No. 15/234,995.
US Office Action dated Nov. 15, 2021 issued in U.S. Appl. No. 16/183,550.
US Office Action dated Nov. 16, 2021 issued in U.S. Appl. No. 16/183,559.
US Office Action dated Nov. 28, 2016 issued in U.S. Appl. No. 14/684,371.
US Office Action dated Oct. 23, 2013 issued in U.S. Appl. No. 13/167,782.
US Office Action dated Sep. 28, 2016 issued in U.S. Appl. No. 14/615,486.
US Office Action dated Sep. 30, 2014 issued in U.S. Appl. No. 14/161,755.
U.S. Appl. No. 17/808,339, inventors Ghantous et al., filed on Jun. 23, 2022.
U.S. Restriction Requirement dated Jul. 1, 2022 in U.S. Appl. No. 17/114,448.
USNotice of Allowance [Supplemental Notice of Allowability] dated Jun. 12, 2017 issued in U.S. Appl. No. 14/615,486.
Zavalis, T., [webpage] "Studying Impedance to Analyze the Li-Ion Battery with an App" Comsol Blog: posted Jul. 14, 2015, pp. 1-3. [retrieved on Feb. 20, 2019] URL:comsol.com/blogs/studying-impedance-to-analyze-the-li-ion-battery-with-an-app/.
U.S. Non-Final Office Action dated Dec. 21, 2022 in U.S. Appl. No. 17/114,448.
U.S. Non-Final office Action dated Feb. 8, 2023 in U.S. Appl. No. 17/303,760.
U.S. Non-Final Office Action dated Feb. 28, 2024 in U.S. Appl. No. 17/808,339.
U.S. Non-Final Office Action dated Mar. 13, 2024 in U.S. Appl. No. 17/930,792.
U.S. Non-Final office Action dated Oct. 6, 2022 in U.S. Appl. No. 17/114,448.
U.S. Non-Final Office Action dated Sep. 27, 2023, in U.S. Appl. No. 18/101,413.
U.S. Notice of Allowance dated Apr. 12, 2023 in U.S. Appl. No. 17/114,448.
U.S. Notice of Allowance dated Apr. 16, 2024 in U.S. Appl. No. 18/340,979.
U.S. Notice of Allowance dated Apr. 24, 2024 in U.S. Appl. No. 18/101,413.
U.S. Notice of Allowance dated Jan. 11, 2024 in U.S. Appl. No. 18/101,413.
U.S. Notice of Allowance dated Jun. 7, 2023 in U.S. Appl. No. 17/303,760.
U.S. Notice of Allowance dated Mar. 31, 2023 in U.S. Appl. No. 17/114,448.
U.S. Appl. No. 18/101,413, inventors Berkowitz et al., filed on Jan. 25, 2023.
U.S. Appl. No. 18/601,939, inventor Ghantous D, filed on Mar. 11, 2024.
U.S. Restriction Requirement dated Nov. 25, 2022 in U.S. Appl. No. 17/303,760.
U.S. Appl. No. 18/670,437, inventor Ghantous D, filed May 21, 2024.

* cited by examiner

BATTERY ADAPTIVE CHARGING USING A BATTERY MODEL

CROSS REFERENCE TO RELATED PATENT APPLICATION

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Batteries and associated charging circuitry are used in many settings and their use continues to grow. Lithium ion batteries are now widely used in many facets of commerce, from powering nearly all portable electronic devices to fully or partially powering many vehicles such as automobiles.

Rechargeable batteries and associated control logic have been engineered to facilitate efficient charging, high capacity, and long life. Unfortunately, a variety of factors reduce the ability of batteries to fully achieve all of these features. Variations in manufacturing and end use lead to wide variations in the ability of any given battery to have both a long cycle life and possess fast charging times.

Characterizing a battery's current state of health and/or determining its future performance would be useful in many contexts.

SUMMARY

One aspect of this disclosure pertains to methods of classifying and adjusting use of a battery. Such methods may be characterized by the following operations: (a) obtaining values of one or more charge process parameters currently applied to or to be applied to the battery; (b) providing the values of the one or more charge process parameters to a battery model; (c) receiving from the battery model, a battery charge process characteristic, and (d) based on the battery charge process characteristic received from the model, (i) adjusting a charge process used to charge the battery and/or (ii) terminating use of the battery, at least temporarily. The battery model may be designed or configured to characterize the battery and the one or more charge process parameters. The battery charge process characteristic may provide a predicted effect of charging the battery under conditions indicated by the one or more process parameters currently applied to or to be applied to the battery.

In certain embodiments, the one or more charge process parameters include at least a state of charge of the battery and a charge current applied to the battery. In certain embodiments, the one or more charge process parameters include at least an open circuit voltage of the battery or a voltage or voltage profile produced in response to a stimulus applied to the battery.

In some cases, the battery model is designed or configured to provide at least two battery charge process characteristics selected from the group: safe charging, safe but slow charging, potentially unsafe charging, and known unsafe charging. In some implementations, the battery model was produced using a machine learning process. In some cases, the method additionally includes modifying the battery model using data obtained from other batteries. The operation may be performed after performing operation (c). In certain embodiments, the battery model accurately provides the predicted effect only for the battery or for a group of batteries of the same battery type. In certain embodiments, the battery model includes a multidimensional plot, a look up table, a neural network a regression model, a support vector machine, a random forest model, or a classification and regression tree.

In certain embodiments, obtaining the values of one or more charge process parameters includes measuring or determining values of current and/or voltage applied to and/or generated across terminals of the battery. In certain embodiments, obtaining the values of one or more charge process parameters includes determining a value of charging current to be applied to the battery in the future.

In some implementations, operations (a)-(d) are performed while the battery is installed in an electronic device. In some implementations, operations (a)-(d) are performed while the battery is being charged.

In some cases, obtaining values of one or more charge process parameters includes: (i) applying a stimulus to the battery; (ii) measuring the battery's response to the stimulus during a time regime or a frequency regime where the battery's response reflects a physical phenomenon occurring in the battery; and (iii) using the battery's response, as measured, to characterize the physical phenomenon.

In certain embodiments, adjusting a charge process used to charge the battery includes adapting a charging process of the battery. As an example, adapting a charging process of the battery may involve modifying one or more current steps or current pulses that are used in the charging process.

Another aspect of the disclosure pertains to battery charging systems for classifying and adjusting use of a battery. Such systems may be characterized by the following elements:

charging and/or monitoring circuitry designed or configured to apply a charge signal to the battery, and measure a voltage at the terminals of the battery; and control circuitry, coupled to the charging and/or monitoring circuitry, and designed or configured to cause the system to: (a) obtain values of one or more charge process parameters currently applied to or to be applied to the battery; (b) provide the current values of the one or more charge process parameters to a battery model designed or configured to characterize the battery and the one or more charge process parameters; (c) receive from the battery model, a battery charge process characteristic that provides a predicted effect of charging the battery under conditions indicated by the one or more process parameters currently applied to or to be applied to the battery, and (d) based on the battery charge process characteristic received from the model, (i) adjust a charge process used to charge the battery and/or (ii) terminate use of the battery, at least temporarily. The control circuitry is designed or configured to cause any appropriate part of the battery charging system to perform any one or more of operations (a)-(d). This includes implementations when the control circuitry itself performs some or all of any of the operations.

In some implementations of the system, the one or more charge process parameters include at least a state of charge of the battery and a charge current applied to the battery. In some implementations, the one or more charge process parameters comprise at least an open circuit voltage of the battery or a voltage or voltage profile produced in response to a stimulus applied to the battery.

As with the methods discussed above, the systems described here may employ battery models characterized by:

a. the battery model is designed or configured to provide at least two battery charge process characteristics selected from the group: safe charging, safe but slow charging, potentially unsafe charging, and known unsafe charging;

b. the battery model was produced using a machine learning process;

c. the battery model is modified using data obtained from other batteries;

d. the battery model accurately provides the predicted effect only for the battery or for a group of batteries of the same battery type; and/or e. the battery model includes a multidimensional plot, a look up table, a neural network a regression model, a support vector machine, a random forest model, or a classification and regression tree.

In certain embodiments of the battery charging system, the control circuitry is configured to obtain the values of one or more charge process parameters from measured or determined values of current and/or voltage applied to and/or generated across terminals of the battery. In certain embodiments of the battery charging system, the control circuitry is configured to obtain the values of one or more charge process parameters from a value of charging current to be applied to the battery in the future.

In certain embodiments, the control circuitry is further configured to perform (a)-(d) while the battery is installed in an electronic device. In certain embodiments, the control circuitry is further configured to perform (a)-(d) while the battery is being charged.

In certain embodiments, the control circuitry is configured to obtain the values of one or more charge process parameters by: applying a stimulus to the battery; measuring the battery's response to the stimulus during a time regime or a frequency regime where the battery's response reflects a physical phenomenon occurring in the battery; and using the battery's response, as measured, to characterize the physical phenomenon.

In certain embodiments, the control circuitry is configured to adjust the charge process by adapting a charging process of the battery. In one example, the control circuitry is configured to adapt the charging process by modifying one or more current steps or current pulses that are used in the charging process.

These and other features of the disclosure will be described below, in more detail, with reference to the associated drawings.

BRIEF DESCRIPTION OF THE DRAWINGS

In the course of the descriptions to follow, reference will be made to the attached drawings. These drawings show different aspects of some implementations, and where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein.

DETAILED DESCRIPTION

Introduction

Figure 1:
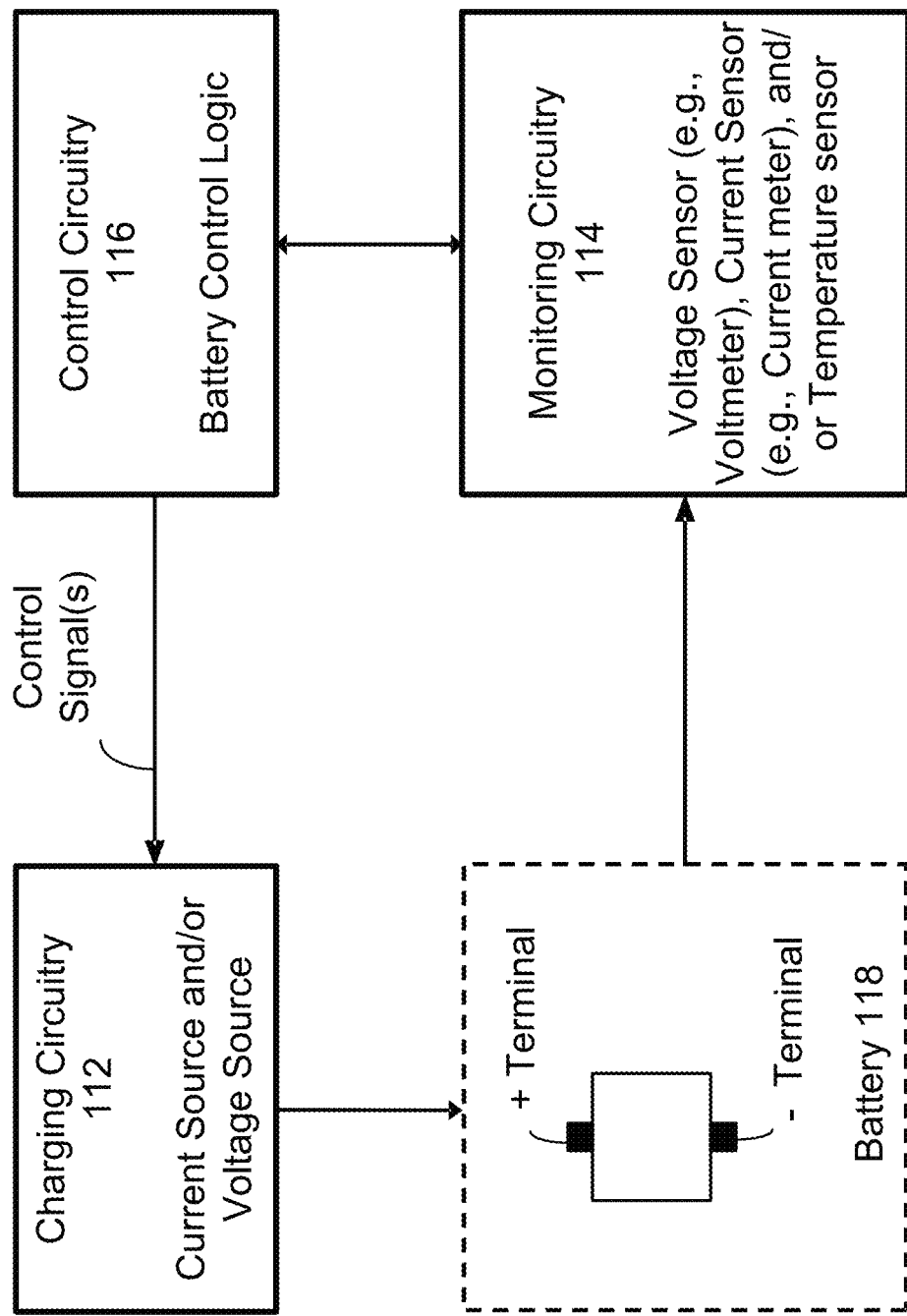
FIG. 1 illustrates, in block diagram form a "battery charging system" or a "battery monitoring system" in conjunction with a battery where charging circuitry 112 (including, e.g., a voltage source and/or current source) responds to control circuitry 116 which receives battery information from monitoring circuitry 114 (including, e.g., a voltmeter and/or a current meter).

In certain embodiments, batteries and associated charging conditions or other operating conditions are evaluated by a computational model that classifies or characterizes the battery and associated conditions. Such battery model may classify batteries according to any of many different considerations such as whether the conditions are safe or unsafe or whether the conditions are likely to unnecessarily degrade the future performance of the battery. In some cases, the battery model executes while the battery is installed in an electronic device such as a smart phone or a vehicle. In some cases, the battery model executes and provides results (e.g., a classification of the battery) in real time while the battery is installed and being charged. In certain embodiments, the battery model is applicable to a single battery or a group of batteries sharing similar characteristics such as the same battery chemistry, the same manufacturer, the same batch, etc. In certain embodiments, the battery model is a machine learning model that may adapt or learn based on information from other batteries.

In various embodiments, data obtained from batteries is considered in one or more time domains characteristic of physical phenomena such as diffusion of ions in a battery electrolyte, diffusion of ions in an electrode matrix (e.g., carbon in the negative electrode of a lithium ion battery), and electrochemical reactions at the interface of the electrolyte and a battery electrode. To this end, a battery may be probed in a manner allowing a battery monitoring and/or charging system to obtain data that characterizes at least two or three of these different battery phenomena. In some cases, the battery's response to a stimulus is analyzed in the frequency domain. In some such cases, the battery is probed at different applied current or voltage frequencies. In some cases, battery data is collected at different times after application of a stimulus (e.g., a current pulse/edge). In one example, the battery data is or includes a battery's charge pulse voltage ("CPV"), which may provide information reflective of diffusion in the battery's solid electrode material. In another example, the battery data may be a battery's partial relaxation time, which provides information reflective of transport in the electrolyte. In various embodiments, the battery is monitored, and data is collected, during charging of the battery. In some cases, the charging, stimulation, and monitoring is accomplished by using a pulsed charge current. The time or frequency-based information may be provided as an input to battery models of the types described herein.

Systems and apparatus may be designed and/or configured to carry out analysis of battery physical phenomena, and characterize batteries based on phenomena occurring at one of the above-mentioned time and/or frequency domains. These systems may be additionally responsible for charging and/or monitoring a rechargeable battery. To this end, such systems may employ battery models of the types described herein.

Terminology

The term "battery" as used herein refers to one or more galvanic cells (each of which stores energy electrochemically). A battery may be an individual cell and/or a plurality of cells arranged electrically in a series and/or parallel configuration. Although some references describe a battery as including two or more cells, the term "battery" is not so limited in this disclosure. In some implementations, a battery is a single cell or multiple cells connected in series or parallel to provide a desired voltage or current rating. Batteries considered herein are typically rechargeable (secondary batteries).

A battery generally contains an anode, a cathode, and an electrolyte or separator. In some contexts, for galvanic electrochemical systems such as batteries, the anode is referred to as the negative electrode and the cathode is referred to as the positive electrode. In operation of a battery, an electrolyte conducts ions but not electrons. During discharge, the negative electrode is oxidized and donates electrons to an external circuit, while the positive electrode is reduced and consumes electrons from an external circuit. During charge, the processes are reversed. In some cases, the negative electrode is an intercalation anode that includes an intercalation matrix or substrate such as carbon, tin, and/or silicon that is configured to insert or intercalate ions during charge. These ions are typically alkali metal ions (e.g., lithium or sodium ions) or alkaline earth metal ions. Other types of battery chemistries or materials may be used in the methods and apparatus of the present disclosure.

An "electronic device" as indicated herein refers to a device that performs any number of tasks or functions electrically and that can be powered by a battery. The device may or may not physically include (e.g., enclose or attach) the battery, battery charging system, or control logic described herein. Electronic devices may be portable or fixed. Examples of electronic devices include mobile phones, digital cameras, laptops, portable speakers, battery powered vehicles, systems for storing solar and other generated electrical energy, uninterruptible power supplies, and power tools.

"Battery parameters" refer to parameters of, or associated with, a battery and its use. Values of battery parameters are often obtained and/or used by battery control logic such as logic used in a battery charger. Examples of types of battery parameters include charge pulse voltage, partial relaxation time, time in service for the battery (e.g., from the time it was installed in the device it powers or when it was first used), and full charge capacity, and projected capacity (typically to some number of cycles. Other battery parameters may reflect battery physical properties such as material transport in an electrode or electrolyte (e.g., diffusion coefficients), reactions or processes within or at the interface of an electrode (e.g., rate constants and double layer capacitance), etc. The values of each of these parameters may vary as a function of the state of charge during the charge portion of a single battery cycle or operating temperature. The parameters values may also vary from cycle-to-cycle over the battery's life.

"Battery type" distinguishes classes or groups of batteries from one another. Among the factors that identify a battery type are (i) battery chemistry (e.g., lithium ion batteries and nickel metal hydride batteries), (ii) battery format (e.g., cylindrical versus prismatic versus pouch) and size (e.g., 18650 versus AA), (iii) manufacturer identity (e.g., Samsung SDI versus Panasonic), (iv) manufacturing process, and (v) manufacturer process implementation (e.g. lot, plant, and/or site). An example of a battery type is an 18650 format rechargeable lithium-ion battery produced by a particular manufacturer (e.g., Samsung SDI, LG Chemical, Murata Energy, etc.) produced in a particular lot using a particular process of the manufacturer. Any one or more of the above factors may be used to define a battery type. Further, the factors may be defined specifically. For example, lithium ion batteries may be divided into types of negative electrodes such as graphite, silicon, and tin or tin oxide.

Figure 2:
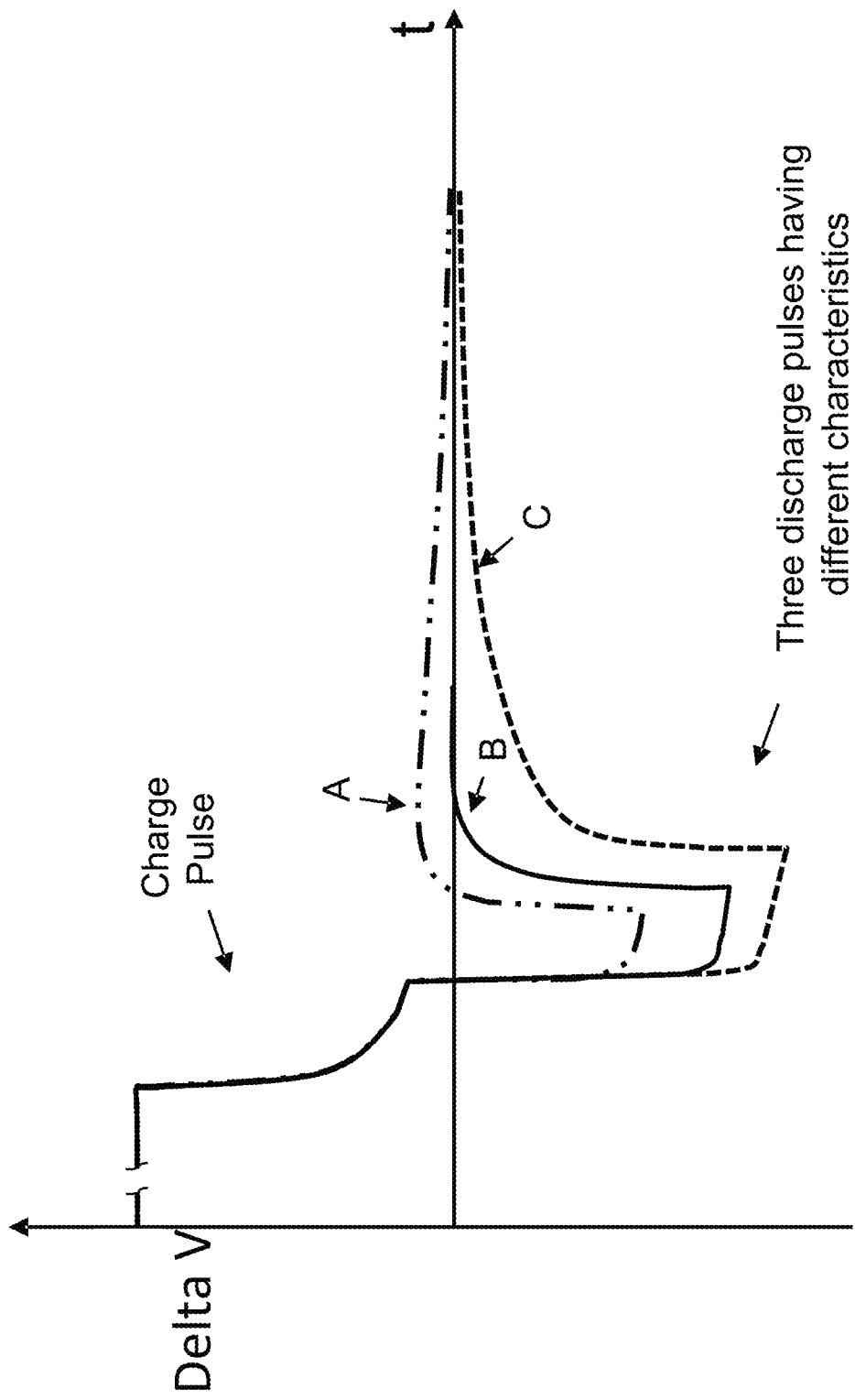
FIG. 2 is an illustration depicting three responses to a charge packet having a charge pulse (which injects charge into the battery) and a discharge pulse (which removes charge from the battery) wherein a first response (A) includes a significant "overshoot" whereby the discharge pulse removed too little charge from the battery, a second response (B) includes no significant "overshoot" or "undershoot" wherein the discharge pulse removes a suitable amount of charge which provides the fastest partial relaxation time of the three responses, and a third response (C) includes a significant "undershoot" whereby the discharge pulse removes too much charge from the battery.
Figure 3B:
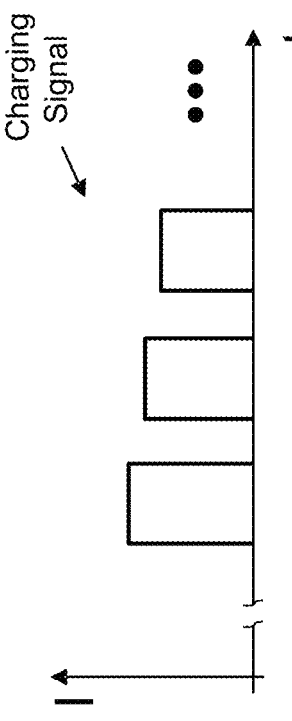
FIGS. 3a-3d illustrate current waveforms of charge signals that may be used to charge a battery.
Figure 3D:
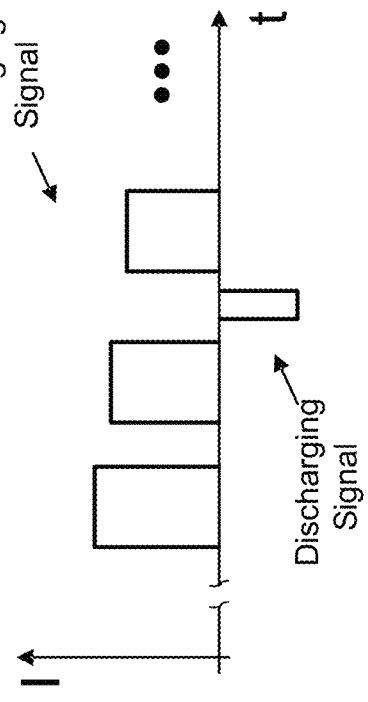
Figure 3A:
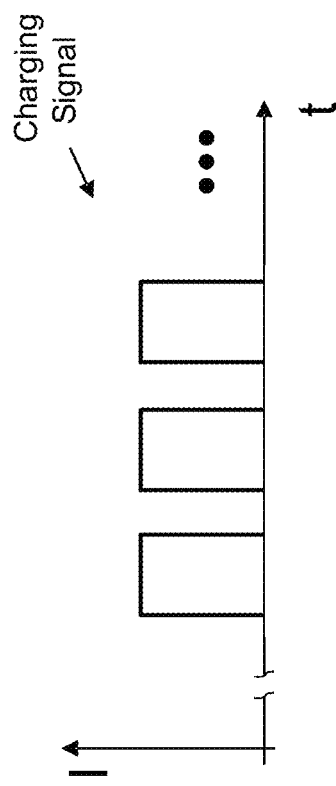
Figure 3C:
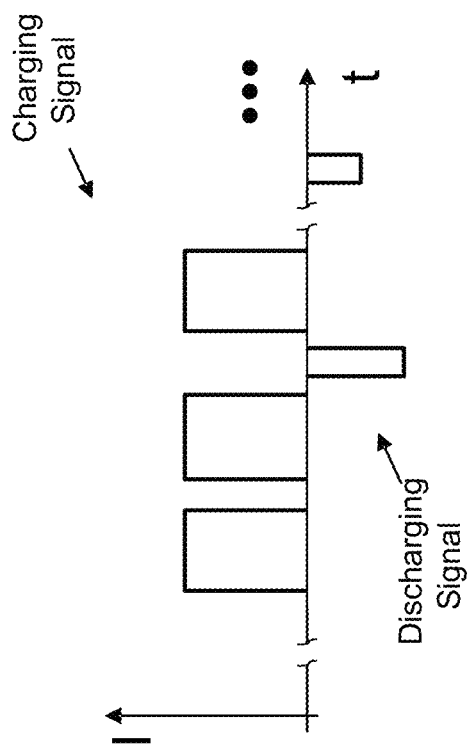

A "charge process" or "charging process" refers to a process in which a battery is charged from a state of less charge to a state of more charge. During a charge process, the battery's state of charge increases. A charge process may be conducted under the control of charging circuitry which may be part of the battery charging system or the battery control logic. In certain embodiments, charging circuitry adapts, adjusts and/or controls the amplitude, pulse width, duty cycle, or other parameter of charging or discharging current pulses and/or it adjusts and/or controls the conditions of a constant voltage portion of the charge process. It may perform any such function to control or adjust a feature of the battery such as the battery's overall charging rate, cycle life, etc. It may perform these functions to control or adjust a more specific characteristic of the battery such as the battery's relaxation time, characteristics of the decay of the terminal voltage (e.g., the rate of decay or the shape of the decay curve), propensity to plate metallic lithium, etc. For example, as depicted in FIG. 2, charging circuitry may adapt, adjust and/or control the amplitude and pulse width of the discharge pulse to reduce or minimize the "overshoot" or "undershoot" of the decay of the terminal voltage of the battery.

A "charge cycle" is the process of charging a rechargeable battery and discharging it with a particular load. A charge cycle may involve charging and discharging an amount of charge that is equivalent or nearly equivalent to the battery's capacity, but not necessarily by one full charge and one full discharge. For instance, using half the charge of a fully charged battery, recharging it, and then using the same amount of charge again, and then subsequently recharging it may count as one charge cycle. The number of charge cycles until a battery fails indicates how many times a rechargeable battery can undergo the process of complete charging and discharging until failing certain criteria. The number of charge cycles may be used to specify a battery's expected life, which may affect battery life more than the mere passage of time.

A "charge signal" refers to the electrical current (e.g., the current waveform) that passes through the terminals of a battery as a result of circuitry configured to apply charge (a charging signal) or remove charge (a discharging signal) from a battery. In various embodiments, one or more charge signals are applied to a battery to charge it, as part of a charge process. A charging or recharging sequence, operation, process, or cycle may include one or more charge signals, which, in total, inject or apply charge into the battery and, optionally, one or more discharge signals (e.g., discharge signals), which, in total, remove charge from the battery. A charge signal may include a plurality of charge packets and/or discharge packets. Each charge packet may represent a portion of a charge sequence and contain one or more charge pulses, discharge pulses and rest periods. Current variations such as edges and pulses may be provided as independent features, outside the concept of a charge packet. Regardless of whether they are part of a charge packet, pulses of a charge signal may be any shape (for example, rectangular, triangle, sinusoidal or square). In some cases, a charge pulse has a temporal duration of between about 1 ms to about 5,000 ms.

"Battery Control Logic" refers to the control algorithms and/or rules that are used to determine (i) charging parameters (for example, the amplitude, width, and frequency of charge and discharge pulses) in the charge process, and/or (ii) information about a battery's health, expected life, defects, its physical and/or material properties, etc. In some embodiments, the algorithms or rules are chosen to improve or balance a battery's cycle life and/or charge speed. In some cases, battery control logic may determine or estimate a battery's state of charge (SOC), state of health (SOH), partial relaxation time, overpotential, or whether metal plating has occurred. In some cases, battery control logic may make use of state of health (SOH) information and/or battery feedback measurements that may include the state of charge (SOC), temperature, voltage, current, and the voltage response shape due to charging and discharging cycles. In some cases, battery control logic employs a battery model to classify a battery and/or the battery when subject to a defined set of charging conditions (e.g., battery charge process parameter values). In certain embodiments, battery control logic is implemented as executable instructions or code stored in hardware (e.g., any of various forms of memory), firmware, or software. The battery control logic may also be considered to include one or more processors configured or designed to execute the instructions or code, particularly when such processors are directly linked to the memory or other storage providing the instructions or code. Unless otherwise stated, the terms battery control circuitry and control circuitry are equivalent to battery control logic. In certain embodiments, battery control logic is part of a battery charging system.

A "battery monitoring system," which may be part of a battery charging system, is used to monitor a battery and use measured frequency or time domain battery data obtained from the battery (and/or characterizing conditions under which the battery is charged or otherwise operated). In various embodiments, the monitoring system provides information to the battery control logic to characterize a battery and/or determine appropriate charging conditions. FIG. 1 depicts in block form an example battery charging system that includes charging circuitry 112 that responds to control circuitry 116 (e.g., battery control logic) that receives battery information from monitoring circuitry 114. FIG. 1 is described in more detail below.

"Capacity" or nominal capacity refers to the total charge (which may be measured in Amp-hours or coulombs) available when the battery is discharged at a certain discharge current (which may be specified as a C-rate) from a fully charged state (e.g., 100 percent state-of-charge) to a defined cut-off voltage. A battery's capacity may change over multiple charge cycles. In conventional batteries, it is common for the battery's capacity to decrease or "fade" over multiple cycles.

The term "capacity fade" refers to reduction of battery capacity over time or multiple charge cycles. A battery's capacity at any given cycle may be based on the maximum battery capacity, at that cycle, or other reference value of battery capacity (e.g., 85% of initial maximum capacity, capacity at specific terminal voltage, etc.)

"Terminal voltage" is the voltage between the battery terminals. Terminal voltage may vary with state of charge and/or the magnitude of discharge or charge current. The terminal voltage may be measured with or without current flowing through a load. In the latter case, the terminal voltage is an open circuit voltage.

An "open circuit voltage" (OCV) is the terminal voltage of a battery in the absence of current flow. It is a property of the cell under a particular set of conditions. A closed circuit voltage (CCV) is the battery terminal in the presence of current flow (e.g., during charging of the battery). CCV is affected by OCV, but also depends on the operation of the battery. For example, during constant current charging, a CCV may be calculated as the sum of the OCV and the charging current multiplied by the resistance of the battery. During constant voltage charge, the CCV is equal to the applied voltage.

"State of charge" (SOC) may refer to the amount of charge currently stored in a battery as a percentage of maximum capacity. SOC is used to characterize how far a battery in use has progressed between a fully charged state and a discharged state. In some cases, state of charge is calculated using current integration to determine the present amount of charge in a battery.

The "state of health" (SOH) of a battery is a parameter that characterizes the "age" or "health" of the battery and/or ability of the battery to hold charge, for example, relative to a given point in the battery's operation (for example, the initial time in operation). The SOH of a battery may provide information to estimate, calculate, measure, and/or determine other battery parameters such as the ability of a battery to hold a charge. The voltage at the terminals of the battery at a given SOC changes as the SOH changes, and hence the voltage curve (voltage versus state of charge) of the battery shifts as it ages and its SOH deteriorates. In yet another aspect, the SOH may be employed to improve the accuracy in estimating the SOC of the battery/cell, which may be a measure or estimate of the available discharge capacity (for example, in connection with a gauge, indicator and/or information which is representative of an available energy capacity of the battery/cell), and/or to improve safety in connection with, for example, charging or recharging a battery/cell. In this regard, as the battery/cell ages, for example as it is repeatedly charged and discharged during use or operation, the SOH of the battery/cell deteriorates and its capacity to store charge decreases or fades. In this aspect, the circuitry and techniques employ the SOH to compensate the data (for example, the SOC of the battery/cell) which may be employed in connection with a gauge, indicator and/or information which is representative of an available energy capacity of the battery/cell. In this way, such a gauge, indicator and/or information provides a more accurate representation of the available energy capacity of the battery/cell. Thus, in this embodiment, the circuitry and techniques which measure or estimate the available discharge capacity of the battery/cell adjust or compensate information which is representative of an available energy capacity of the battery/cell using the SOH of the battery/cell. The state of health parameter is further described in U.S. Pat. No. 9,121,910, issued Sep. 1, 2015, which is incorporated herein by reference in its entirety.

A "charge pulse voltage" (CPV) is a voltage measurement that may be characterized as (i) a peak voltage, measured at the terminals of the battery/cell, which is produced by the battery in response to a change in current (e.g., an edge or pulse) to which the battery voltage responses, and/or (ii) a substantial peak voltage (e.g., within 5-10% of the peak voltage), measured at the terminals of the battery/cell, which is produced by the battery in response to a charge pulse. In some cases, a CPV measurement is used by an adaptive charging process. In some cases, a CPV measurement is taken to determine a battery parameter such as SOC or SOH.

A "battery model" or simply a "model" is mathematical construct, software, and/or other logic that may classify a battery or a particular set of charge process parameters applied to or characterizing the battery. Examples of such parameters include a battery's state of charge, temperature, charge voltage, open circuit voltage, charge current, the properties and state of its internal materials, the battery's design, etc. The model takes as inputs information about the battery itself and/or the charge process parameters and outputs one or more charge process characteristics of the battery. The charge characteristics may represent a conclusion about the appropriateness of the charge process parameters (e.g., safe, potentially unsafe, or unsafe charging conditions) and/or a prediction about the results or effects of the charge process parameters on the battery; e.g., the effects of subjecting the battery to the input set of charge process parameters.

A model may be applicable to just a particular individual battery or to a plurality of batteries of the same battery type or within a group of related battery types. In some cases, a model accounts for the state of health of a battery. For example, if irreversible damage to the battery cell has occurred, a model may reflect the battery's state of health. More generally, the model may evolve or learn based on information and/or data it gains from application to one or more batteries. Some changes to the model may result from changes in a battery itself, e.g., changes in its health or material properties, as mentioned. Other changes to the model may result from observing and incorporating different situations encountered during battery charging. Such observing and learning may be implemented as machine learning or deep learning.

A model may take any of various forms. In one example, the model takes the form of a lookup table. In another example, the model takes the form of one or more expressions, matrices, etc. such as regression relationships, neural networks, decision trees, and the like.

"Measuring," "collecting," or "capturing" a parameter as stated herein is a way of obtaining a value of the parameter. For instance, measuring the voltage of a battery can mean using an instrument such as a voltmeter to directly measure the voltage between terminals of the battery. In some contexts, it means obtaining parameter values related to raw measurements of the battery and/or deriving other information about the battery (e.g., partial relaxation, battery swelling, etc.). Raw measurements of a battery may include current (applied or generated), charge accepted or passed, voltage, and temperature.

Numeric ranges are inclusive of the numbers defining the range. It is intended that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

The headings provided herein are not intended to limit the disclosure.

Unless defined otherwise herein, all technical and scientific terms herein have the same meaning as commonly understood by one of ordinary skill in the art. Various scientific dictionaries that include the terms included herein are well-known and available to those in the art. Although any methods and materials similar or equivalent to those described herein find use in the practice or testing of the implementations disclosed herein, some methods and materials are described.

As used herein, the singular terms "a," "an," and "the" include the plural reference unless the context clearly indicates otherwise.

The logical connector "or" as used herein is inclusive unless specified otherwise. As such, condition "A or B" is satisfied by "A and B" unless specified otherwise.

Adaptive Charging

Adaptive charging as described herein refers to charging processes that make use of feedback related to battery conditions, environmental conditions, user behavior, user preferences, battery diagnostic information, physical properties of the battery and the like. Using adaptive charging techniques, one or more characteristics of a charge signal may be continuously or periodically adjusted or controlled while charging a battery. Such adjustment or control may be performed to maintain battery parameter values within a selected range. Generally, adaptive charging is used to optimize the battery's cycle life, optimize its charge speed, minimize its swelling, and/or keep it operating within safe boundaries. For example, adaptive charging may keep a battery charge process operating in a regime where minimal or no battery degradation, such as from metal plating (e.g., metallic lithium plating), occurs or is likely to occur. Various types of battery parameter values may be captured and used for adaptive charging. Some of these parameter values are obtained by measuring parameters directly associated with the battery, charging system, and/or the device powered by the battery. For example, parameter values may be obtained from battery terminal voltage measurements, battery temperature, battery size, and the like. In some cases, adaptive charging also makes use of parameters not directly associated with a battery. Examples include user information and environmental information. Examples of indirectly obtained battery parameters that may be used for adaptive charging include charge pulse voltage, partial relaxation time, the state of charge, and the battery's state of health. In some cases, ranges of acceptable values of each of these parameters may vary as a function of the state of charge during the charge portion of a battery cycle. The parameters values may also vary from cycle-to-cycle over the battery's life. In some cases, adaptive charging may also make use of the current charging parameters such as the current or voltage that is being applied to a battery by charging circuitry.

Various adaptive charging techniques are described in applications assigned to Qnovo Inc. of Newark, CA Examples of such patents include U.S. Pat. No. 8,638,070, titled "METHOD AND CIRCUITRY TO ADAPTIVELY CHARGE A BATTERY/CELL," issued Jan. 28, 2014; U.S. Pat. No. 8,791,669, titled "METHOD AND CIRCUITRY TO ADAPTIVELY CHARGE A BATTERY/CELL," issued Jul. 24, 2014; U.S. Pat. No. 9,121,910, titled "METHOD AND CIRCUITRY TO ADAPTIVELY CHARGE A BATTERY/CELL USING THE STATE OF HEALTH THEREOF," issued Sep. 1, 2015; U.S. Pat. No. 9,142,994, titled "METHOD AND CIRCUITRY TO ADAPTIVELY CHARGE A BATTERY/CELL," issued Sep. 22, 2015; U.S. Pat. No. 9,035,623, titled "MONITOR AND CONTROL CIRCUITRY FOR CHARGING A BATTERY/CELL, AND METHODS OF OPERATING SAME," issued May 19, 2015; and U.S. Pat. No. 8,907,631, titled "ADAPTIVE CHARGING TECHNIQUE AND CIRCUITRY FOR A BATTERY/CELL USING MULTIPLE CHARGING CIRCUITS AND TEMPERATURE DATE," which issued Dec. 9, 2014. Each of these patents is incorporated herein by reference in its entirety.

In some embodiments, battery parameters used in adaptive charging include physical characteristics of the battery that are reflective of a battery's response in certain frequency or time domains, such as those associated with metal ion diffusion in the battery's electrolyte or electrode (anode or cathode), and/or reaction rates at the battery's anode or cathode. Such characteristics may be derived using electrochemical impedance spectroscopy or related techniques.

Figure 8A:
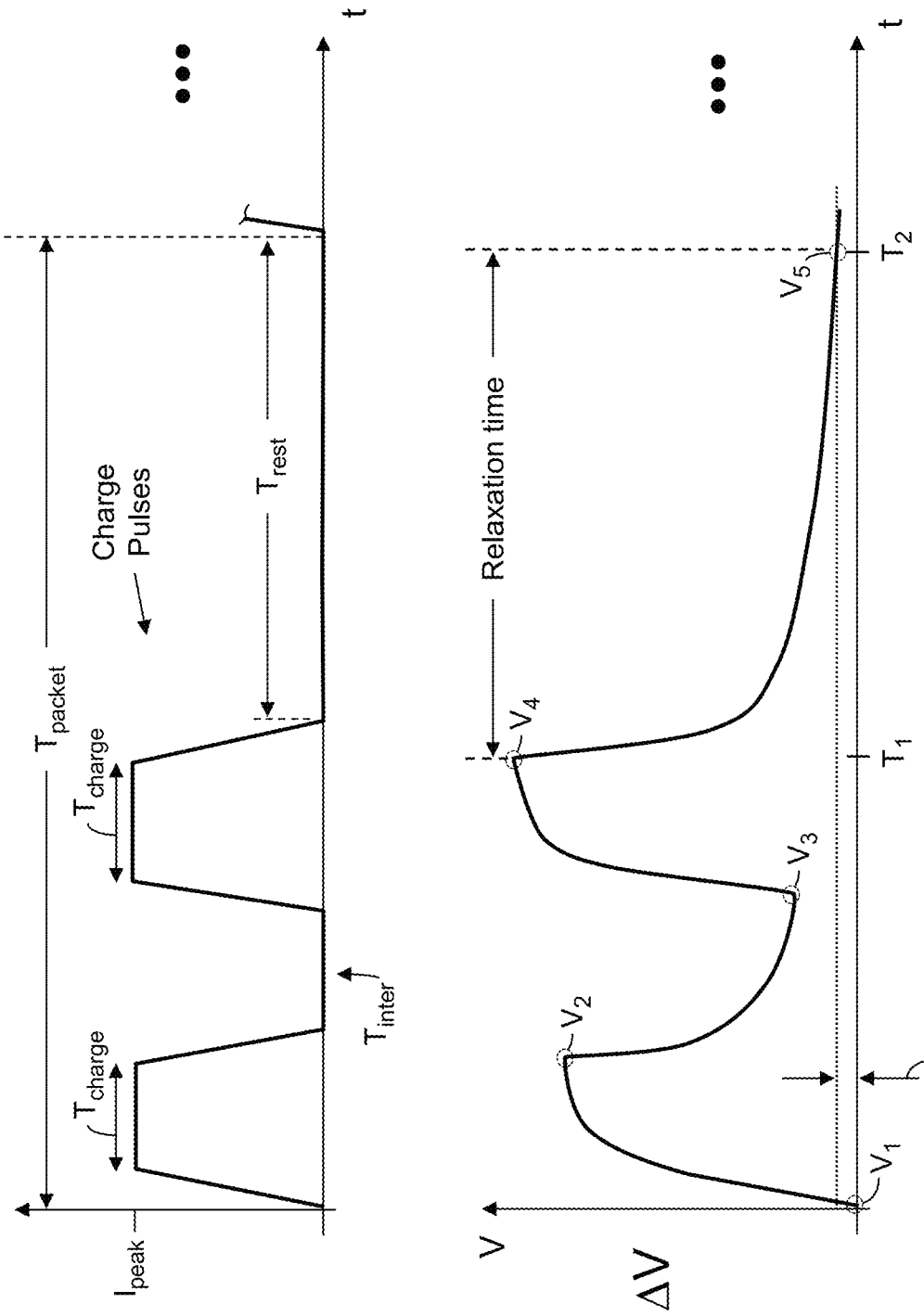
FIG. 8a illustrates a charge sequence having two charge pulses (each including a charging period ($T_{charge}$)) followed by a rest period ($T_{rest}$) where the period of the charge sequence is identified as $T_{packet}$, according to certain aspects of the present disclosure; a terminal voltage response of the battery/cell to such charge sequence is illustrated where a first voltage ($V_1$) is identified (which correlates to the beginning of the first charge pulse and, in this embodiment, the beginning of the sequence), a second voltage ($V_2$) is identified (which correlates to the end of the first charge pulse and/or the peak of the change in the terminal voltage due to the first charge pulse), a third voltage ($V_3$) is identified (which correlates to the beginning of the second charge pulse), a fourth voltage ($V_4$) is identified (which correlates to the end of the second charge pulse and/or the peak of the change in the terminal voltage due to the second charge pulse) and a fifth voltage ($V_5$) is identified (which correlates to when the terminal voltage of the battery/cell decays to a predetermined value (for example, less than about 10% of peak deviation relative to the terminal voltage of the battery/cell when the charge/discharge sequence is applied (here, $V_1$) or less than 5% of such peak deviation); where the partial relaxation time (PRT) of the battery/cell due to the charge sequence may be the amount of time between (i) the termination/end of the second charge pulse and/or the peak of the change in the terminal voltage due to the second charge pulse and (ii) when the terminal voltage of the battery/cell decays to a predetermined value (for example, less than 10% of peak deviation, or less than 5% of peak deviation).
Figure 8B:
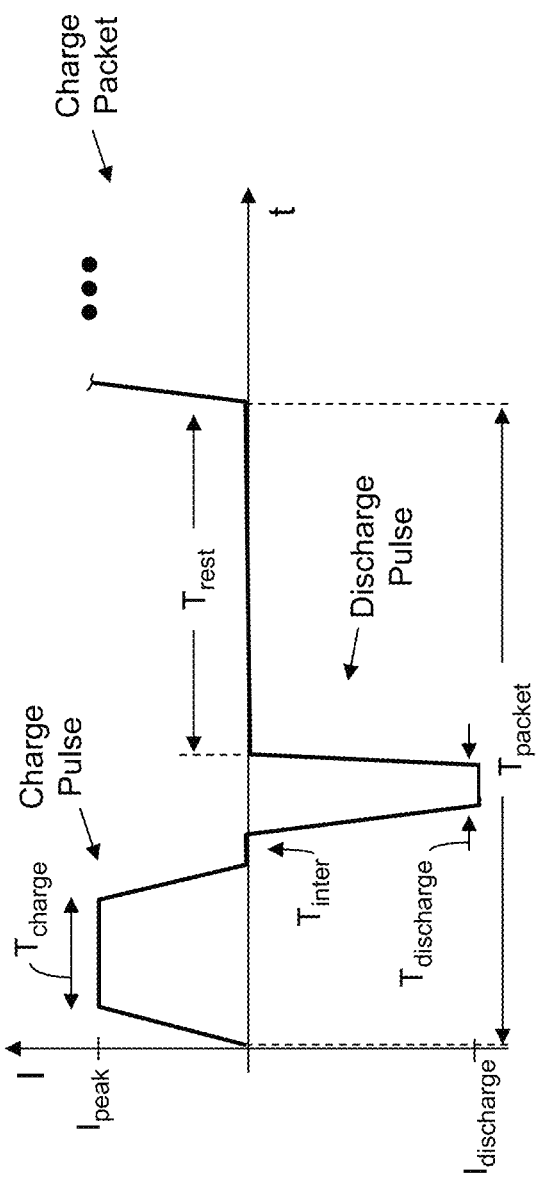
FIG. 8b illustrates an exemplary charge sequence having a charge pulse (which injects charge into the battery/cell) and a discharge pulse (which removes charge from the battery/cell) where the charge pulse includes a charging period ($T_{charge}$) and the discharge pulse includes a discharging period ($T_{discharge}$), according to certain aspects of the present disclosure; notably, in this charge sequence, an intermediate rest period ($T_{inter}$) is disposed between the charge and discharge pulses, and a rest period ($T_{rest}$) is disposed after the discharge pulse and before the next sequence; an exemplary terminal voltage response of the battery/cell to such charge sequence is illustrated where a first voltage ($V_1$) is identified (which correlates to the beginning of the charge pulse and, in this embodiment, the beginning of the sequence), a second voltage ($V_2$) is identified (which correlates to the end of the charge pulse and/or the peak of the change in the terminal voltage due to the charge pulse), a third voltage ($V_3$) is identified (which correlates to the end of the discharge pulse and/or the peak of the change in the terminal voltage due to the discharge pulse) and a fourth voltage ($V_4$) is identified (which correlates to when the terminal voltage of the battery/cell decays to a predetermined value (for example, preferably less than 10% of peak deviation relative to the terminal voltage of the battery/cell when the charge/discharge sequence is applied (here, $V_1$) and, more specifically, less than 5% of peak deviation); where the relaxation time of the battery/cell due to the charge sequence may be represented as the amount of time between (i) the termination/end of the discharge pulse and/or the peak of the change in the terminal voltage due to the discharge pulse (see, $V_3$ and $T_1$) and (ii) when the terminal voltage of the battery/cell decays to a predetermined value (for example, preferably less than 10% of peak deviation and, more preferably, less than 5% of peak deviation) (see, $V_4$ and $T_2$); notably some or all of the characteristics of the charge pulses (for example, pulse amplitude, pulse width/duration and pulse shape) are programmable and/or controllable via charging circuitry where the amplitude of the positive and/or negative pulses may vary within the charge sequence (and are programmable and/or controllable), the duration and/or timing of the rest periods may vary within the sequence (and are programmable and/or controllable) and/or, in addition, such pulses may be equally or unequally spaced within the sequence; the combination of charging pulses, discharging pulses and rest periods may be repetitive and thereby forms a sequence that may be repeated; all combination or permutations of pulse, pulse characteristics, periods, sequences and signal characteristics and configurations are intended to fall within the scope of the present disclosure; moreover, discharge sequences may have similar characteristics as charge sequences except, however, a net charge is removed from the battery/cell; for the sake of brevity, the discussion/illustration with respect to discharge sequence will not be repeated. All of these possible combinations may be applied as part of an adaptive charging process.
Figure 8B:
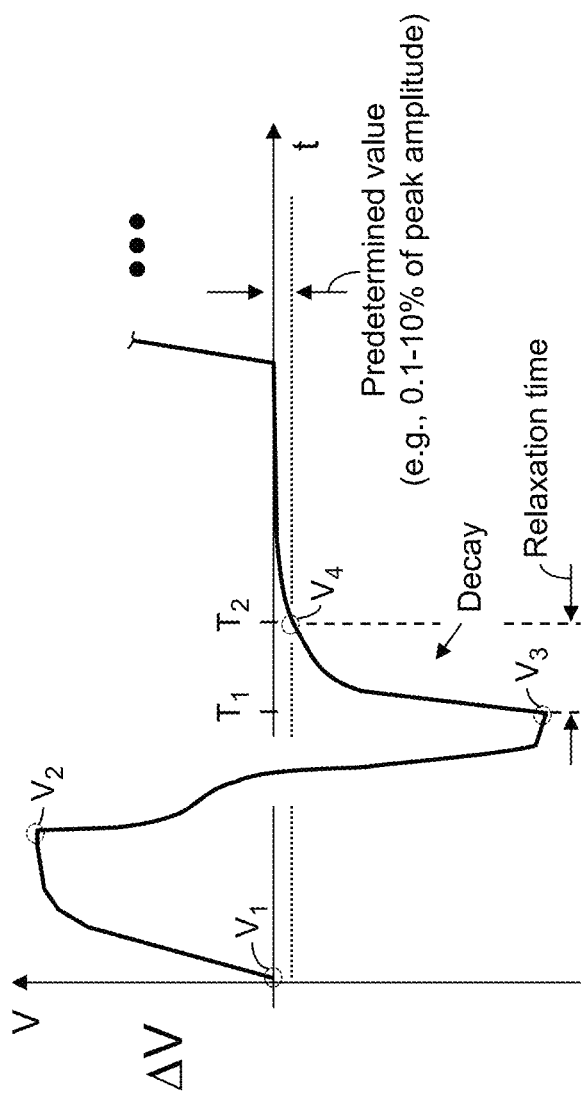
Figure 8C:
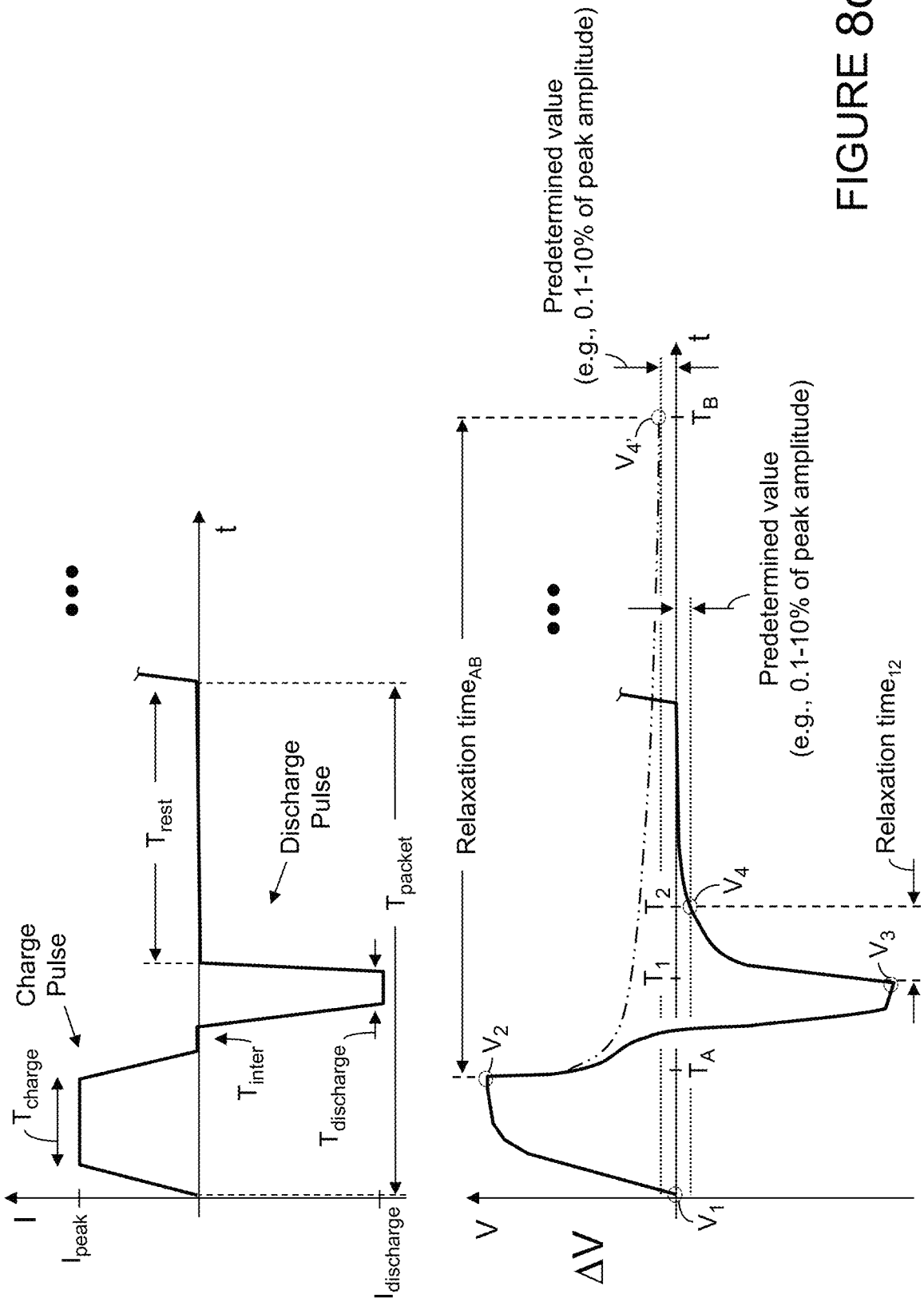
FIG. 8c illustrates a charge sequence like that of FIG. 8b where the sequence includes a charge pulse (which injects charge into the battery/cell) and a discharge pulse (which removes charge from the battery/cell) where the charge pulse includes a charging period ($T_{charge}$) and the discharge pulse includes a discharging period ($T_{discharge}$), according to certain aspects of the present disclosure; in this illustration, a partial relaxation time corresponding to the charge pulse of the sequence is also depicted (see, Relaxation time) where one measure of the relaxation time associated with the charge pulse is equal to the difference between $T_A$ (which coincides with $V_2$) and $T_B$ (which coincides with $V_{4'}$). Another measure of relaxation time is the time between the end of the discharge pulse or edge and the point when the voltage value has decayed to the predetermined value (e.g., $T_B-T_1$). Regardless of how it is measured, the relaxation time of the battery/cell in response to the charge sequence having a charge pulse and discharge pulse may be shorter than the relaxation time of the battery/cell in response to the charge sequence not having a discharge pulse (compare $T_B-T_1$ of FIG. 8c and $T_2-T_1$ of FIG. 8a) and, as such, under certain circumstances, the total charging time of a charging sequence having charge and discharge pulses may be shorter than the charging time of a charging sequence having no discharge pulses to shorten or reduce the relaxation time.

To illustrate an example of adaptive charging, FIG. 2 shows how a charging process can reduce or minimize the "overshoot" or "undershoot" of the decay of the terminal voltage of the battery by adjusting the amplitude and pulse width of a discharge pulse. When a charge process provides an "overshoot" of the decay of the terminal voltage of the battery relative to partial equilibrium (see discharge pulse A), the charging circuitry may adjust the characteristics of the discharge pulse by, e.g., increasing the amount of charge removed by the discharge pulse. For example, by increasing the amplitude and/or pulse width of the discharge pulse, the overshoot may be corrected. When a charge process results in an "undershoot" of the decay of the terminal voltage of the battery relative to partial equilibrium (see discharge pulse C), charging circuitry may decrease the amount of charge removed by the discharge pulse (for example, via decreasing the amplitude and/or pulse width of the discharge pulse). As such, the control circuitry may adjust the characteristics of one or more subsequent discharge pulses (for example, the amplitude, pulse width, and/or pulse shape) to control or adjust rate, shape and/or characteristics of the decay of the terminal voltage of the battery. Other examples of charge process modification to accomplish adaptive charging include modifying the rate or amount of charge injected to the battery during charging. In general, in one class of adaptive charging techniques, the charge process changes the amplitude and/or duration of one or more discharge pulses to stimulate a desired response in the partial relaxation time. Examples of adjustable parameters of discharge pulses are illustrated in FIGS. 8b and 8c.

FIGS. 3a-3d present example waveforms of charge signals. A charging or recharging sequence, operation, or cycle may include charging signals (which, in total, inject or apply charge into the battery) and discharging signals (which, in total, remove charge from the battery). Charging signals may decrease according to a predetermined rate and/or pattern (for example, asymptotically, linearly or quadraticaly) as, e.g., the terminal voltage of the battery increases during a charging or recharging sequence, operation, or cycle (see, e.g., FIGS. 3b and 3d). In some cases, a pulse charging sequence or operation may include a constant voltage (CV) phase after a period of pulse charging and/or upon charging the battery/cell to a predetermined state of charge. In some embodiments, the period prior to the CV phase involves controlling current delivered to the battery. In some cases, this phase is nominally a constant current (CC) phase—although pulses may be superimposed—or a current step phase.

FIGS. 4a-4e illustrate charge and/or discharge packets of the charging and discharging signals (which are illustrated in FIGS. 3a-3d), where such charge and discharge packets may include one or more charge pulses and one or more discharge pulses. In some embodiments, a charge signal of FIGS. 3a-3d includes a plurality of packets (for example, about 100 to about 50,000 packets) and, in some embodiments, each packet may include a plurality of charge pulses, discharge pulses, and rest periods. More generally, a charge packet includes one or more changes in charging current or other charging parameter. In some cases, the change(s) contained in a charge packet include an edge in the charge current. When pulses are used, they may be of any shape—for example, pulses may be, rectangular, triangular, sinusoidal, or square. In some embodiments, charge and/or discharge pulses of the packet may include a temporal duration of between about 1 ms to about 2000 ms, and preferably less than 1000 ms. Note that the concept of a "packet" is not essential to characterize a charging process. Some pulse charge processes may be amply described as a series of charge (and optionally discharge) pulses or steps. Step charging protocols are within the purview of this disclosure. Adaptive charging may involve modifying the amplitude, duration, and/or other characteristic of one or more steps in a step charging process.

Figure 4A:
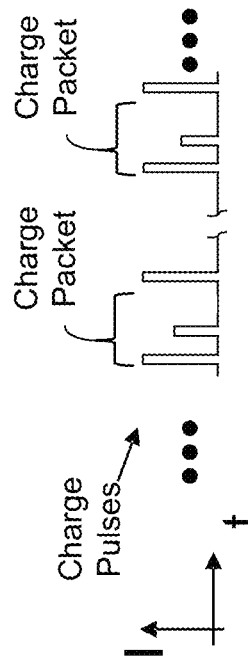
FIGS. 4a-4g depict charge and discharge packets of charging and discharging signals.
Figure 4B:
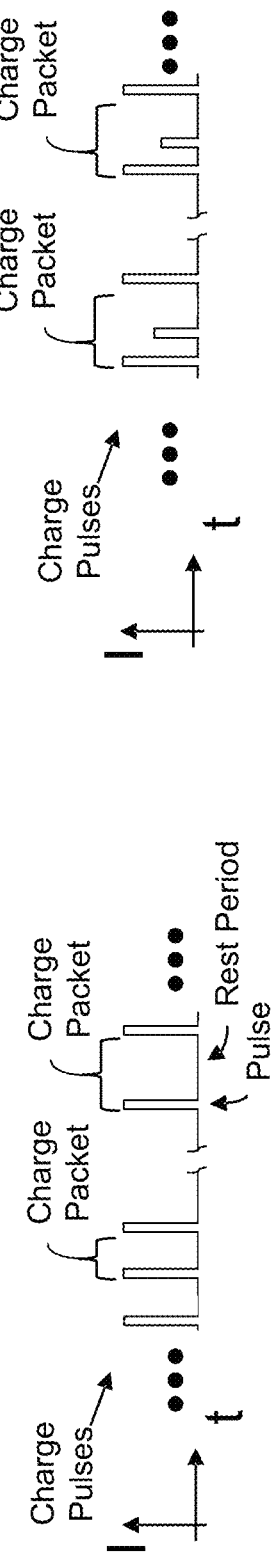
Figure 4C:
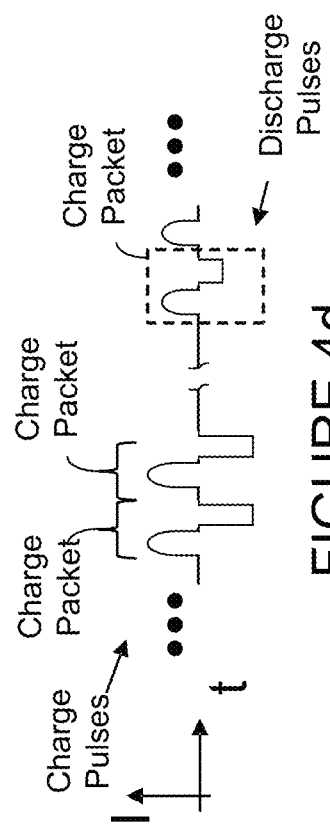
Figure 4D:
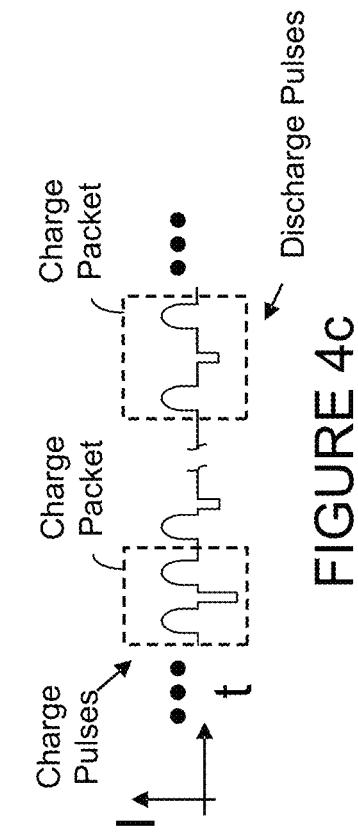
Figure 4E:
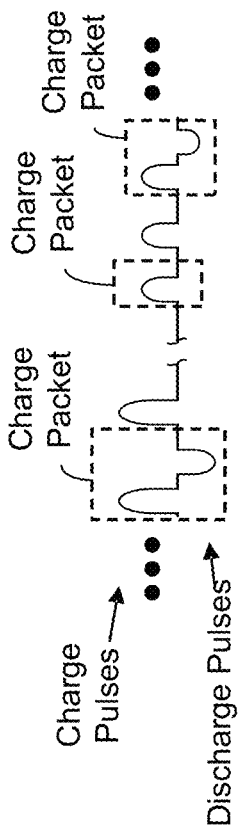
Figure 4G:
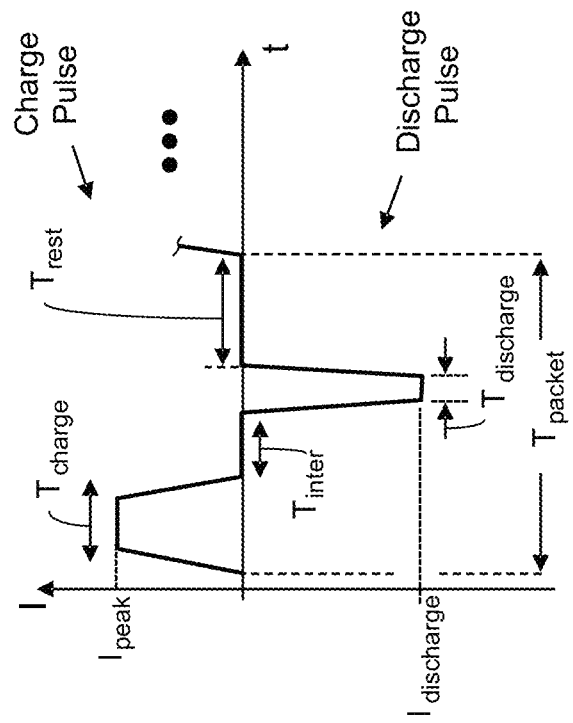
Figure 4F:
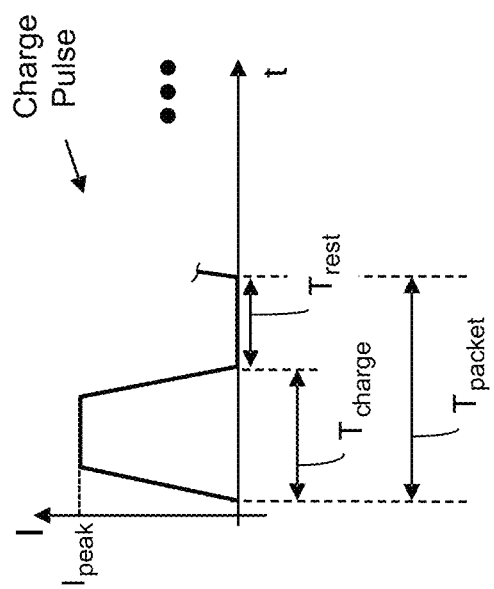

FIG. 4f illustrates an example of a charge packet having a charge pulse that includes a charging period ($T_{charge}$) followed by a rest period ($T_{rest}$) where the period of the charge packet is identified as $T_{packet}$.

FIG. 4g illustrates an example of a charge packet having a charge pulse (which injects charge into the battery) and a discharge pulse (which removes charge from the battery) where the charge pulse includes a charging period ($T_{charge}$) and the discharge pulse includes a discharging period ($T_{discharge}$). As depicted, an intermediate rest period ($T_{inter}$) is disposed between the charge and discharge pulses, and a rest period ($T_{rest}$) is disposed after the discharge pulse and before the next packet.

Discharge signals may be employed to reduce the time period for the battery terminal voltage to return to equilibrium. In this regard, the discharge period may remove excess charge that might otherwise contribute to degradation mechanisms such as the thickening of the solid-electrolyte interface (SEI) layer or metallic plating of lithium. The difference between the electrical charge added to the cell during a charging period and the electrical charge removed from the cell during a discharge period determines a net total electrical charge added to the cell in one period. This net total electrical charge divided by the period may determine a net effective charging current.

There are numerous combinations and permutations involving the amount of electrical charge added to the battery during the charge signal and the amount of charge removed during the discharge signal. All permutations are intended to fall within the scope of the present disclosure. For example, each permutation may result in a different rate, shape and/or characteristics of the decay of the terminal voltage of the battery. Moreover, within each permutation, there exists a large number of sub-permutations that i) combine the characteristics of a charge signal (for example, the duration, shape and/or amplitude of the charge signal), the product of which determines the amount of electrical charge added to the cell; and ii) combine the characteristics of a discharge signal (for example, the duration, shape and/or amplitude of a discharge signal), the product of which determines the amount of electrical charge removed from the cell; and iii) the length of time of the rest period. The characteristics of a charge signal may differ from the characteristics of a discharge signal. That is, one or more of the duration, shape and/or amplitude of the charge signal may differ from one or more of the duration, shape and/or amplitude of the discharge signal.

Some or all of the characteristics of the charge and discharge pulses or steps may be programmable and/or controllable. For example, the pulse or step amplitude, width/duration, and shape may be adjusted. In other examples, the amplitude of the positive and/or negative pulses may vary within the packet, the duration and/or timing of the rest periods may vary within the packet, and/or pulses may be equally or unequally spaced within the packet. The combination of charging pulses, discharging pulses and rest periods may be repetitive, thereby forming a packet that may be repeated.

Figure 5A:
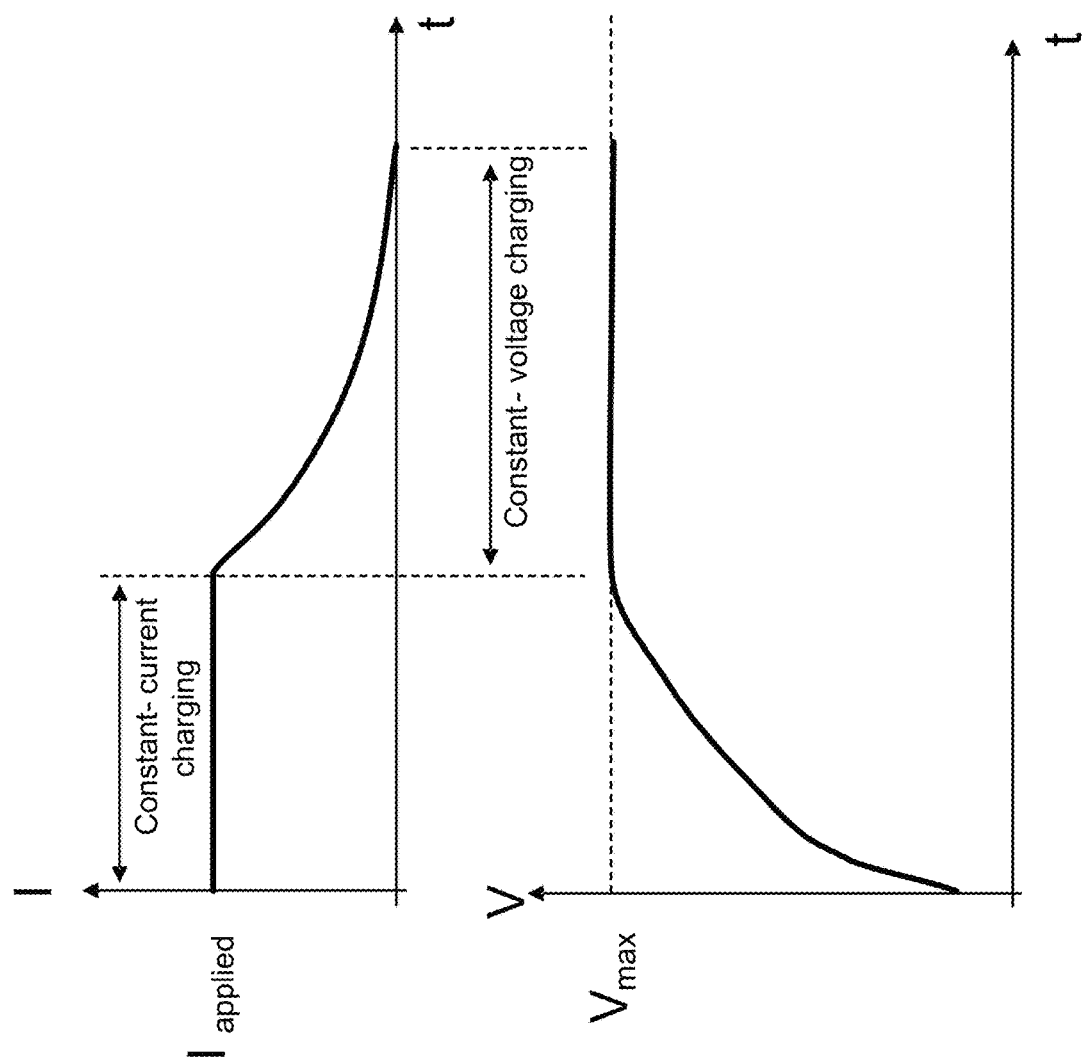
FIGS. 5a-b depict current and voltage waveforms resulting from charging a battery using a constant-current constant-voltage (CCCV) technique and an adapted CCCV technique which includes a plurality of constant charge pulses. Adapting a CCCV technique may involve modifying one or more characteristics of a constant-current portion of the charge process. An example of such modification includes changing the magnitude of the applied current, which may involve changing the current magnitude or duration in one or more steps if the constant-current portion is implemented as current steps. Another example may involve changing the criteria for transitioning from the constant-current to the constant-voltage portion of the charge process.

FIG. 5a illustrates current and voltage of a battery as a function of time illustrating the conventional charging method known as constant-current, constant-voltage (CCCV). When charging a rechargeable battery (e.g., a lithium-ion type rechargeable battery) using CCCV, the charging sequence includes a constant-current (CC) charging mode until the terminal voltage of the battery/cell is at about a maximum amplitude (for example, about 4.2V to 4.5V for certain lithium-ion type rechargeable batteries) at which point the charging sequence changes from the constant-current charging mode to a constant-voltage (CV) charging mode. In the CV mode, a constant voltage is applied to the terminals of the battery. Generally when charging a rechargeable battery using the CCCV technique, the charging circuitry changes from the CC charging mode to the CV charging mode when the state of charge (SOC) of the battery is at, e.g., about 60-80%, although in some embodiments, as described herein, a charging circuitry does not enter a CV charging mode until the battery charge is greater than about 90% SOC or greater than about 95% SOC. Adaptive charging may be employed to adjust the CC and/or CV portions of a CCCV charging process. Adaptive charging may also be employed to adjust the transition from the CC to the CV portion of the process.

Figure 5B:
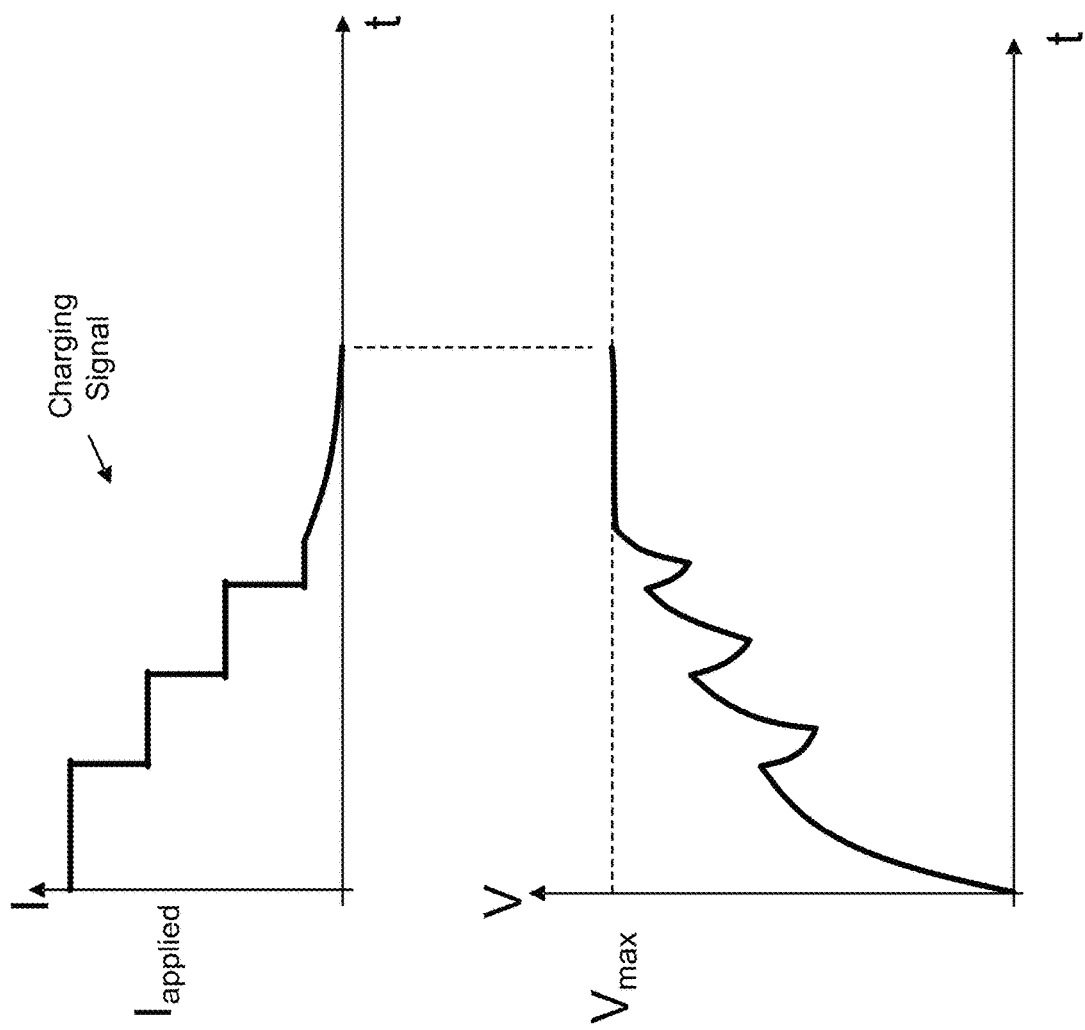

FIG. 5b illustrates current and voltage of a battery as a function of time when charged by a step-charging technique. FIG. 5b shows a single example of a step charging technique. A step-charging process of a rechargeable battery (e.g., a lithium-ion type rechargeable battery) employs a multiple step constant-current (CC) charging mode until, e.g., the terminal voltage of the battery is at about a maximum amplitude (for example, about 4.2V to 4.5V for certain lithium-ion type rechargeable batteries) at which point the charging sequence changes from the constant-current charging mode to a constant-voltage (CV) charging mode. As with the CCCV technique depicted in FIG. 5a, a constant voltage is applied to the terminals of the battery while in the CV mode. And as with the technique depicted in FIG. 5a, adaptive charging may be employed to adjust the CC (including individual steps, amplitude, duration) portion, the CV portion, and/or the transition from the CC to the CV portion of the process.

Battery Models and Their Use
Battery Model Overview

Aspects of this disclosure pertain to models or similar tools for characterizing or classifying a battery and/or a battery's characteristics (e.g., charge characteristics) at various points in the battery's life, some or all of which may be when the battery is in service, as for example when the battery is installed in an electronic device such as a phone, an automobile, etc. In certain embodiments, models are developed or refined using information about a battery collected while the battery is in service. Regardless of how a model is generated and/or updated, it may classify a battery in a way that identifies different charge process regimes or characteristics of the battery.

Figure 5C:
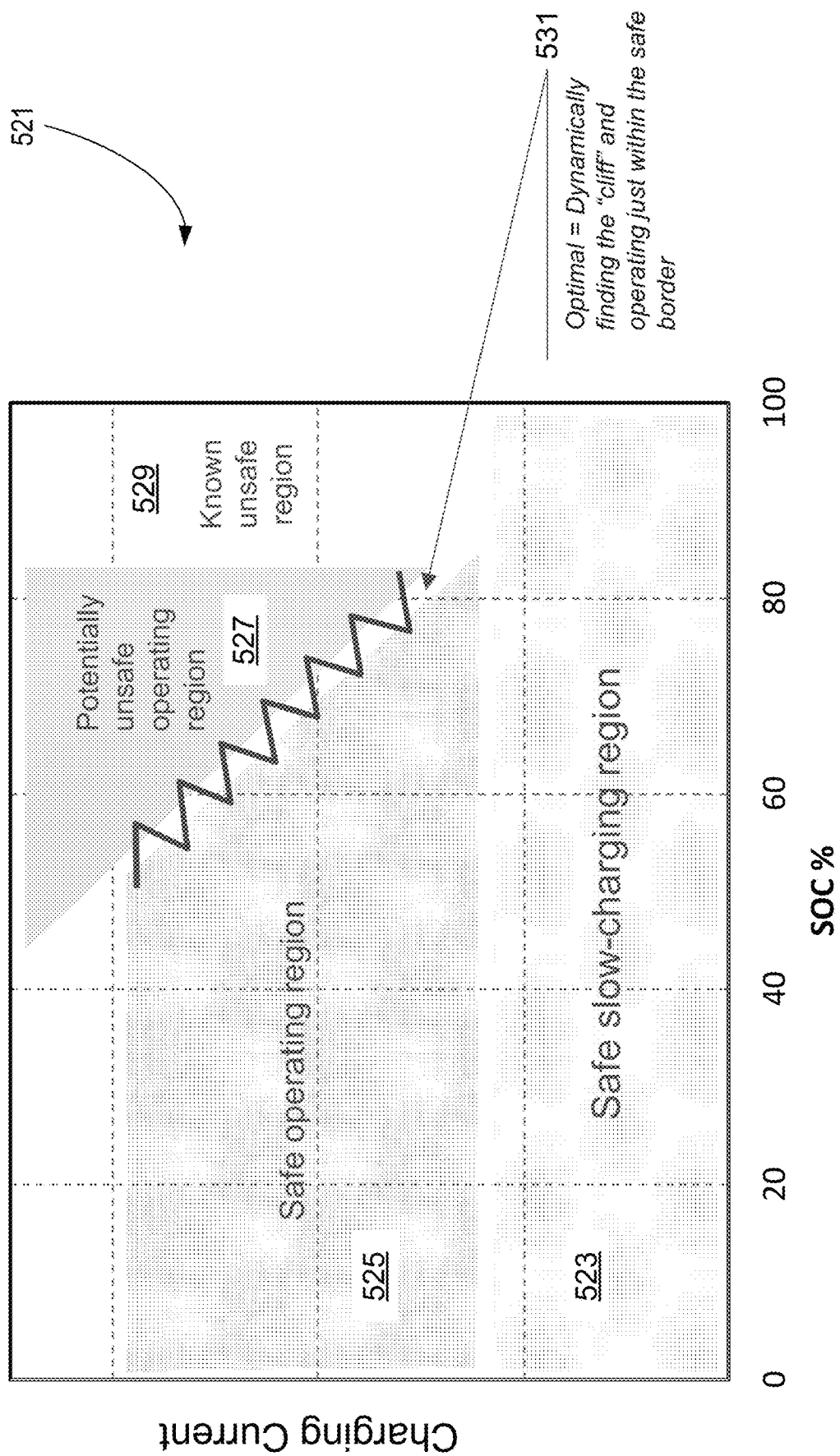
FIG. 5c depicts a simple example of a battery model for relating battery charge process parameter values to battery charge process characteristics or classifications.

A simple pictorial example of a two-dimensional battery model is represented in FIG. 5c. As shown, the model classifies charge process parameters for a particular battery—in this particular case, values of state of charge and charge current. Using these charge parameters, the model classifies the charging process according to a particular state: safe, safe and slow, potentially unsafe, and known unsafe, thereby defining inter-relationships between the parameters under consideration (in this simple example, state of charge and charging current). Understand that while the plot of FIG. 5c shows charge current and state of charge as charge process parameters, often a model will consider other and/or additional charge process parameters and/or operating conditions such as temperature, terminal voltage (provided in isolation or as a response to a stimulus such as an applied current edge), battery age/health, material properties, sampling periods to obtain the requisite information, durations of measurement, etc., all of which may constitute independent axes in a multi-dimensional model. At the core of the multi-dimensional models are relationships that connect the independent parameters (and axes) to each other. These relationships then determine the optimal charging and operation of a battery.

In some cases, a battery's charge process parameters may be visualized in a battery parameter space having a number of dimensions associated with these parameters. Thus, while FIG. 5c shows two dimensions of battery charge process parameter space, other examples have three or more such dimensions. The number of battery charge process parameters included in a model (and hence a multidimensional space considered by the model) depends on the ability of chosen parameters to accurately and/or safely classify a battery or serve another requirement. In certain embodiments, the model employs at least two battery charge parameters, or at least about five battery charge parameters. Regardless of the number of dimensions, each set of battery charging process parameter values, alone or in combination with battery type information, represents a point in the multidimensional parameter space.

As used herein, the term battery charge process parameters or just battery charge parameters indicates information about a battery, sometimes including information about a battery's charge conditions, (e.g., state of charge and current magnitude) that may be input to a model, while the term battery charge process characteristics or just battery charge characteristics indicates a conclusion or prediction about the results or appropriateness of the battery when subjected to particular battery charge parameters. Examples of battery charge process characteristics include safe operating conditions, potentially unsafe operating conditions, and known unsafe operating conditions. Distinct battery charge process characteristics may occupy different regions or regimes in a multidimensional space representing battery charge process parameters. In other words, the space is divided into regions, each associated with a different classification or characteristic of a given battery. The boundaries between these regions may be sharp or graded (i.e., the transition between a safe to a potentially safe charge process region may occur over distance in parameter space). See the distinct regions in FIG. 5c. A battery model classifies a battery and associated charge process parameters into one of the regimes/characteristics.

Alternatively, or in addition, to simply classifying a battery by position in multidimensional battery parameter space, a battery model may produce a score based on battery charge process parameter values, optionally with weights applied to individual parameter values. For example, the score may be a weighted summation of selected individual battery charge process parameters. In certain embodiments, the weights can be computed from statistical analyses of the properties of previously tested batteries. Other functions of the battery charge process parameters, such as non-linear functions, may be used to obtain a score.

In some embodiments, principal component analysis or a similar technique for reducing dimensionality is applied to a data set containing charge process parameter values for batteries and their associated charging procedures. The principal components of the dataset define vectors of maximum variation through the multidimensional parameter space. The principal components may be used in a reduced dimension battery parameter space. In some cases, a battery model is trained or otherwise designed to use parameter values presented in terms of principal components.

In certain embodiments, separate models are provided for different batteries. This reflects the fact that individual batteries frequently have different characteristics, which result from different designs, manufacturing, handling, and/or use in service. In some implementations, multiple batteries of the same type (e.g., the same size, format, chemistry, manufacture, and batch) may use the same model, at least initially. Over time, the models for individual ones of these batteries of the same type may evolve or develop into different models to account for distinct observed properties, which may result from initially unknown differences or from use patterns differences. As should be apparent from this example, models can change over time, and the changes can be dictated by observed changes in a battery's response to particular stimuli or other conditions. Some examples of battery responses are described below with respect to time domain and frequency domain battery information. For example, a battery model may employ electrochemical impedance spectroscopy (EIS) or EIS-like information to generate or refine or train a model.

In certain embodiments, the battery is evaluated in situ using a model. That is, the battery need not be removed from its electronic device in order to be classified by the model. Collection of battery parameter values and application to a battery model may be conducted in a way that is unobtrusive, e.g., during charging and in a way that does not significantly slow or modify the charging. In some implementations or some use patterns, the model may conduct its evaluations without being noticed by the user of the device powered by the battery.

The battery charge process characteristics provided by a model may inform decisions about future performance of battery and/or actions to be taken to address potential safety hazards, performance degradation, charging procedures, etc. For example, a particular model for a particular battery may indicate that the battery can or should be charged with a current of greater than 0.5 A when the battery's state of charge is 40% at a given temperature. The same model may indicate that the battery can be comfortably and appropriately charged with a current of about 0.6 A when the battery's state of charge is 80% at the same temperature. Still further, the model may indicate that the battery definitely should not be charged with a current of greater than 0.5 A when the battery's state of charge is 90% also at the same temperature. In certain embodiments, the battery charge characteristics are used to adapt charge process parameters (e.g., as with adaptive charging described herein).

B. Input and Output Variables

As explained, a battery model may receive as inputs various battery charge process parameters. Examples of classes of these parameters include the following: (a) applied current characteristics (e.g., magnitude or shape such as pulse, edge, or step characteristics), (b) measured voltage across the battery terminals (e.g., as a function of time after the applied current pulse(s) or at fixed times after the current pulse(s)) (measured at various times after the stimulus or in response to various stimulus frequencies), (c) state of charge (determined by open circuit voltage, coulombs passed, etc.), (d) temperature (measured via a temperature sensor and optionally provided as a function of time after the applied current pulse or at fixed times after the current pulse), (e) battery age (cycle count, days in service, etc.), (f) previously generated output variables and/or battery state of health, (g) sampling frequencies of the current and/or voltage values, (h) duration of the sampling and measurement period (sampling frequency and duration point to different physical and chemical processes within the battery), (i) design values of the battery obtained either directly from the manufacturer or through physical dissection of the battery (e.g., material thicknesses, dimensions, properties of the electrolyte, known temperature dependences of such material properties), and the like.

In certain embodiments, battery models are configured to receive parameter values for both current applied to the battery and voltage across the battery terminals. In some cases, battery models use, in addition, some combination of parameters of the types (c)-(f) listed above. In certain embodiments, battery models use the battery's applied and/or measured current at multiple different states of charge; in other words, at various states of charge, encountered over the course of a single charge process or over multiple charge processes. In certain embodiments, battery models use (i) the charge current, (ii) associated terminal voltage, and (iii) state of charge are provided as inputs to the model. Note that the charge current used in models may be, e.g., an instantaneous charge current or an average charge current. In some cases, an instantaneous charge current is obtained over a period of milliseconds to tens of seconds. Regardless of what battery charge process parameter values are input to the model, the model classifies the charge process having these parameter values. Note that the current and voltage values, as well as certain other charge process parameters, may be provided in a particular time domain or frequency domain, as is further explained below.

To generate values of certain of these input variables, a battery system may apply a stimulus, which may be a current pulse applied at a specified state of charge. In response to the applied stimulus, the system measures the terminal voltage, and optionally one or more other parameter values such as the temperature of the battery.

The applied current is not necessarily a current pulse; in various embodiments it is some form of an edge, which is a change in the magnitude of applied current. From the perspective of signal theory, an edge contains harmonic frequencies, which may be considered when evaluating a battery's response to the applied current edge. The fundamental and harmonic frequencies may be the primary mechanism to stimulate the battery's response. Note that the magnitude of current edge need not go to zero Amps to provide an edge; it merely has to change in value and in time. Further, the edge need not be vertical, as in the case of an edge of a triangular wave. The rate at which the edge changes should contain a sufficient frequency bandwidth to stimulate the frequencies of interest within the battery. The terminal voltage and/or other parameter may be measured at various times during or after application of the current edge. Alternatively, in some circumstances, the stimulus itself may be the terminal voltage instead of the terminal current.

The model output classifies a battery under a set of conditions. The model may do this for conditions at the time of the measurement or at some other time such as a future time when exposed to a hypothetical set of conditions (e.g., an anticipated future applied current magnitude at a particular state of charge and temperature).

In certain embodiments, the classification provided by a battery model allows the charging system to suggest or implement a change in a charge condition (e.g., an increased or decreased instantaneous or average current). In certain embodiments, the classification allows the control system associated with the battery or an electronic device in which the battery is installed to determine whether the battery is operating in a potentially unsafe mode and should be flagged for further observation or have its operation terminated. In certain embodiments, the classification allows the system to determine that the battery is in imminent danger of failure and/or represents a serious safety concern. In such cases, a system may prevent further charging and/or discharging until the battery has been removed or replaced from the device.

Returning to FIG. 5c, a classification plot 521 represents a simplified pictorial example of a battery model for a given battery or a family of batteries. The plot 521 provides four discrete regions that represent four different battery charge process characteristics. As shown, these are a safe but slow charging region 523, a generally safe operating region 525, a potentially unsafe operating region 527, and known unsafe operating region 529. If the charging process operates in the safe but slow charging region 523, the battery is unlikely to be damaged or destroyed, but it might be charged more rapidly without problem. In other words, while the battery is safely charged in region 523, the charging process logic might determine that the battery should be charged faster, possibly to a level within the region 525. As shown, region 525 lies above (has a higher charging current) than region 523, but it does not extend into high states of charge. In other words, a charging process that operates at both a high state of charge and a high charge current is deemed unsafe by the battery model. Generally, batteries operating in region 525 are considered to be safely charged at an adequately fast charge rate. It is readily possible to picture a multi-dimensional version of FIG. 5c where additional parameters (or axes) are added, such as temperature, health and/or aging, operating condition, etc.

As shown, the model characterizes charging processes that use relatively high charging currents at high states of charge as either potentially unsafe (region 527) or known to be unsafe (529). A known unsafe operating region may be one where a failure of the battery may lead in due time to a fire or explosion. For example, a buildup of metallic lithium may cause dendritic filaments that can cause an internal electric short-circuit thereby leading to a rapid discharge of the battery and a likely fire. A potentially unsafe region is one where the risk of failure is elevated, but where failure may or may not involve fire or explosion. If a device's charging logic determines that a battery is operating in one of these regions or will soon be operating in one of them, it may adjust its charging parameters to stay out of these regions.

In some embodiments, the charging logic attempts to operate close to a boundary 531 between safe region 525 and potentially unsafe operating region 527. Of course, the logic will attempt to stay on the safe side of boundary 531, but this of course requires that the model accurately defines the boundary. Further, the boundary can vary from battery-to-battery, or even at different evaluation times for a given battery.

These boundaries or thresholds between different regions may, in some cases, depend on previous or on-going measurements of battery properties such as voltage measured in response to particular stimuli. For example, a current charge threshold (e.g., for boundary 531) may be relaxed if there is a detected gradual (or abrupt) change in the battery's response to particular stimuli, which response indicates that operating at higher currents does not pose a safety threat. In certain embodiments, the boundary determination is made (and periodically updated) using an optimization scheme that takes, e.g., various EIS measurements as inputs and determines how they relate to a defined specification (e.g., charge time, cycle life, health and aging progression, etc.). The boundary determination or update may iterate this process using present and historical data and inputs, if necessary, to adjust the model, which allows for updating an optimal charge process configuration.

As indicated, the model illustrated in FIG. 5c provides just one of example of many possible model structures. The parameters considered to define the space in which a charge process for a battery is classified can include, as examples, any one or more of the following: state of charge, charge current (average, peak, etc.), voltage responses (which may be provided at various time or frequency regimes), etc.

C. Developing the Model

To develop a battery model, a group of batteries such as those of a particular battery type provided by a particular vendor is analyzed for such factors as the state of health of the battery under various conditions, the failure of the battery, and safety issues. Safety issues include such issues as plating of metal onto the anode during charge and consequent formation of conductive dendrites, loss of battery electrolyte, swelling, and fire or explosion of the battery.

The computational system or individual(s) charged with developing the model analyzes some or all of the above-identified input variables for patterns or trends that are reflected in a computational model that classifies batteries based on values of the input variables (charge process parameters). Information about each battery including battery charge process parameters and associated battery charge process characteristics/classifications may collectively serve as a training set for developing the battery model.

Batteries chosen for study in a developing model may be selected based on various criteria. As mentioned, they may all be of the same type, but in some cases other criteria are used. For example, the batteries may be selected based on differences in how a battery operates, which may be determined based on physical know-how. Thus, in some cases, an expert possessing such knowledge considers model empirical parameters that may be due to, e.g., manufacturing variability and factors this association into choosing batteries for developing a battery model. In other cases, a computational system selects batteries to be analyzed for developing a battery model.

The mechanics of developing a battery model can take various forms. In one approach, one or more experts analyze battery data and make determinations of what are safe and unsafe regions of battery charging process parameter space. Other methods include various computational modelling and machine learning techniques that can identify patterns in the input variables and associated conditions of batteries (e.g., normal or expected behavior, unexpected degradation, potentially dangerous to operate, and imminent failure or imminent safety issue).

A battery model may take various forms. Examples include CART (Classification and Regression Trees), random forest models, neural network, regression model, support vector machines, probabilities models (e.g., log likelihood), look up tables, and other models and relationships known to those of skill in the art.

D. Using the Model

A model may be executed at any of various locations. In certain embodiments, logic for executing the battery model resides entirely on the device or the device charger (e.g., with a battery pack or a processor used by the device for other purposes). In certain embodiments, logic for executing the battery model resides at a remote location (e.g., a cloud or a server under the control the battery manufacturer, the device manufacturer, or the battery charging/monitoring system provider). In certain embodiments, logic for executing the battery model is distributed between local and remote resources.

As explained, in some implementations, battery control logic may monitor or otherwise determine parameters associated with a charging process. Some of these may be used as battery charging process parameters, e.g., inputs to a battery model. These parameters may be provided directly or indirectly from the measurement circuitry. See e.g., FIG. 1. Raw battery measurements taken by the measurement circuitry include but are not limited to temperature, voltage, current, charge passed, and time from or between events. In some embodiments, raw battery measurements are passed to the control circuitry, which may employ logic to determine parameters such as SOC, SOH, overpotential, and PRT. Depending on the design of the battery model, any raw or derived measurements and parameters may be used by battery models. As an example, measurements such as a battery's SOC are made directly by measurement circuitry and passed to a battery model. Raw and/or derived parameters may be stored locally or on a remote device and provided, at an appropriate time, to the battery model for analysis and ultimately to provide a battery charge process classification. The analyzed present and/or historical data and/or battery charge process classification may be fed back into the battery control logic to allow for, e.g., adaptive charging, safety alerts, etc.

In some implementations, battery models are trained or further refined over time, such as when service data from one or more batteries is collected, to improve the performance of the models. In some cases, multiple batteries, such as batteries on phones, can provide information that serves as data points for further training a model. For example, when a battery experiences failure, as detected by the device or by a user, the data leading up to or otherwise associated with the failure can be used to improve the accuracy of a battery model. This approach may, e.g., identify rare manufacturing defects.

The model results or outputs may be treated or used in various ways. In one approach, model results/outputs broadly classify a battery as behaving (a) as expected for a normal battery of similar age, (b) in a way suggesting a premature failure risk, or (c) in a way that poses a safety risk. If the battery is behaving as expected, the battery charging system may adapt the charge protocol to permit faster charging. If the battery is behaving in a way suggesting that it might fail prematurely, the battery charging system or other logic may send an alert to the user, and/or the manufacturer, and/or adapt the charging protocol to extend the battery life. If an alert is sent, it might trigger a warranty clause for the device and/or battery, and/or it might suggest early replacement of the battery. If the battery is behaving in a way that poses a safety risk, the responsible system may shut down the device and send a warning to immediately replace the battery or device or take some other precaution.

Characterizing Battery Physical Phenomena a. Time Regimes and Battery Phenomena

Battery performance is affected by various phenomena, each having an associated response time to events that can occur during battery charging. While not an exhaustive list, three classes of phenomena will be used as examples: (1) lithium ion transport in electrolyte, (2) reaction kinetics occurring at the electrode surface (often the anode), and (3) lithium ion diffusion within the solid matrix of an electrode (anode or cathode). Understand that while this disclosure frequently makes reference to lithium ions, the disclosed concepts extend to battery systems that employ other types of current carrying ions such as sodium ions.

Lithium-ion transport in a battery's electrolyte, which may be quiescent, is typically caused by some combination of migration (movement of charged species in an electric field) and diffusion (movement driven by a concentration gradient) in the electrolyte. This transport is a relatively fast process and is reflected in data obtained (i) with a high-frequency stimulus (e.g., a high frequency current signal applied in electrochemical impedance spectroscopy) and/or (ii) at short times after a stimulus is applied. The response time of lithium ions in a battery electrolyte is typically on the order of a few to tens of milliseconds, although it may be slower in some types of electrolytes, particularly some solid state electrolytes, in which case the response time is typically on the order of up to about 1 to 5 seconds. Transport of metal ions in a liquid battery electrolyte may be reflected in battery response characteristics such as partial relaxation time (see e.g., FIGS. 8a-c).

Kinetics of reactions taking place at the interface of the electrode(s) in a battery are governed by various factors. In the anode or negative electrode (during charging), the changes in the reaction kinetics can reflect the growth of an SEI layer and/or the nature of electrochemical reactions at the interface. These phenomena are noticeable in data acquired in response to an intermediate frequency stimulus in the case of electrochemical impedance spectroscopy. The response time of an interfacial reaction in a battery is typically on the order of a few milliseconds and is typically longer than the response time of ion transport in the electrolyte. Interfacial reactions at battery's electrode surface (e.g., anode surface) may be reflected in battery response characteristics such as partial relaxation time, overpotential, and CPV.

Transport of lithium ions in the solid electrode material such as carbon or silicon or metal oxide may be reflected by the diffusion of lithium ions in the solid matrix of the electrode. Characterization of this phenomenon can be obtained using relatively low frequency stimulation. The response time of diffusion of metal ions in an anode active material (e.g., lithium ions in graphite) of a battery is typically on the order of few to tens of seconds and is typically longer than the response time of reaction kinetics at the electrolyte-electrode interface. Transport of metal ions in the solid particles of the electrode may be reflected in battery response characteristics such as charge pulse voltage (CPV) and relaxation time.

Note that a response time in a battery may be measured from a step or pulse and may be characterized by a time constant. In this context, a time constant may be understood to represent the elapsed time required for the battery response to decay to a near-equilibrium value if the system had continued to decay at the initial rate. In the case of an exponential decay, the response will have actually decreased in value to in this time (from a step decrease). In an increasing exponential system, the time constant is the time for the battery's response to reach its final (asymptotic) value (from a step increase). For certain battery processes, the rate of decay is close to an exponential decay, but it is not actually an exponential decay.

The time constant for full relaxation is on the order of hundreds of milliseconds to seconds. The time constant for CPV is similar. The time constant for partial relaxation is on the order of tens of milliseconds. As explained, each reflect a different process within the battery. Each is also stimulated by a "pulse" or "edge" of sufficient bandwidth (i.e., contains enough harmonics). Regarding measurement of relaxation time versus partial relaxation time, shorter measurement duration (after application of the current edge or other stimulus) and faster sampling tend toward partial relaxation time, while longer measurement duration and slower sampling tend toward full relaxation time. In certain embodiments, although this is not required, relaxation time is measured with a positive current step or pulse, and partial relaxation time is measured with a negative current step or pulse.

a. Electrochemical Impedance Spectroscopy

Electrochemical impedance spectroscopy is conventionally performed by applying a small excitation signal, typically an AC potential, to the electrochemical cell and measuring the resulting current through the cell. Assuming that a sinusoidal excitation potential is applied, the response is a sinusoidal current signal. By measuring the amplitude of the response and the phase difference between the excitation and response, both as a function of applied frequency, a test system can provide information about the mechanisms or performance of the electrochemical cell. This information includes or is influenced by the response times discussed above.

Approaches to analyzing electrochemical impedance spectroscopy data often model electrochemical cells using equivalent circuit elements such as resistors and capacitors. Charge transfer, reaction kinetics, diffusion, and other electrochemical phenomena can be represented as circuit elements, and a battery can be represented as one or more circuits having such elements arranged in series or parallel or a combination of series and parallel. Some models use empirically derived elements as alternatives to or partial substitutes for physical model elements (e.g., physical circuit elements such as resistors, capacitors, and combinations thereof).

Some electrochemical impedance spectroscopy tools attempt to find a model whose calculated impedance matches the measured impedance of a battery under consideration. When model parameters provide good agreement with observed electrochemical impedance spectroscopy results, the model parameters can provide good physical insight into the operation of a battery. Electrochemical impedance spectroscopy (EIS) is further described in the book "Electrochemical Impedance Spectroscopy and its Applications," by A. Lasia, (2014), Springer, published by Springer, which is incorporated herein by reference in its entirety.

In certain embodiments, an EIS applied stimulus is provided by superimposing a known signal of a single frequency and scanning the frequency. In some implementations, EIS applied stimulus is provided in the form of current pulses at various frequencies where a particular type of battery phenomenon can be characterized. In certain embodiments, a battery is probed, in situ, by applying a signal of various harmonic frequencies during battery charging or during some other time. As with conventional EIS, the applied pulses may include a wide range of frequencies, which may be provided over a continuous or near continuous range. Alternatively, discrete ranges of frequency can be applied. In all cases, the response of the battery is monitored. Together the voltage and current values provide impedance information used to characterize the battery. In some scenarios, the stimulus is current and the measured response voltage. However, the reverse can be employed.

As mentioned, lithium-ion transport in an electrolyte is a relatively fast process, which means that it is reflected in high-frequency data determined with electrochemical impedance spectroscopy. Examples of such frequencies are in the range of about 100 Hz to 2 kHz, or equivalently short durations of time, e.g., about 10 ms to 100 ms. Kinetics of reactions taking place at the interface of the electrode are noticeable in data acquired at intermediate frequencies, e.g., frequencies in the range of about 10 Hz to 0.5 kHz, or equivalently short durations of time, e.g., about 2 ms to 100 ms. Diffusion of lithium ions in the solid anode material such as carbon or silicon can be characterized at relatively low excitation frequencies, e.g., frequencies in the range of about 1 mHz to 1 Hz, or equivalently longer durations of time, e.g., about 1 second to 1,000 seconds.

Figure 6:
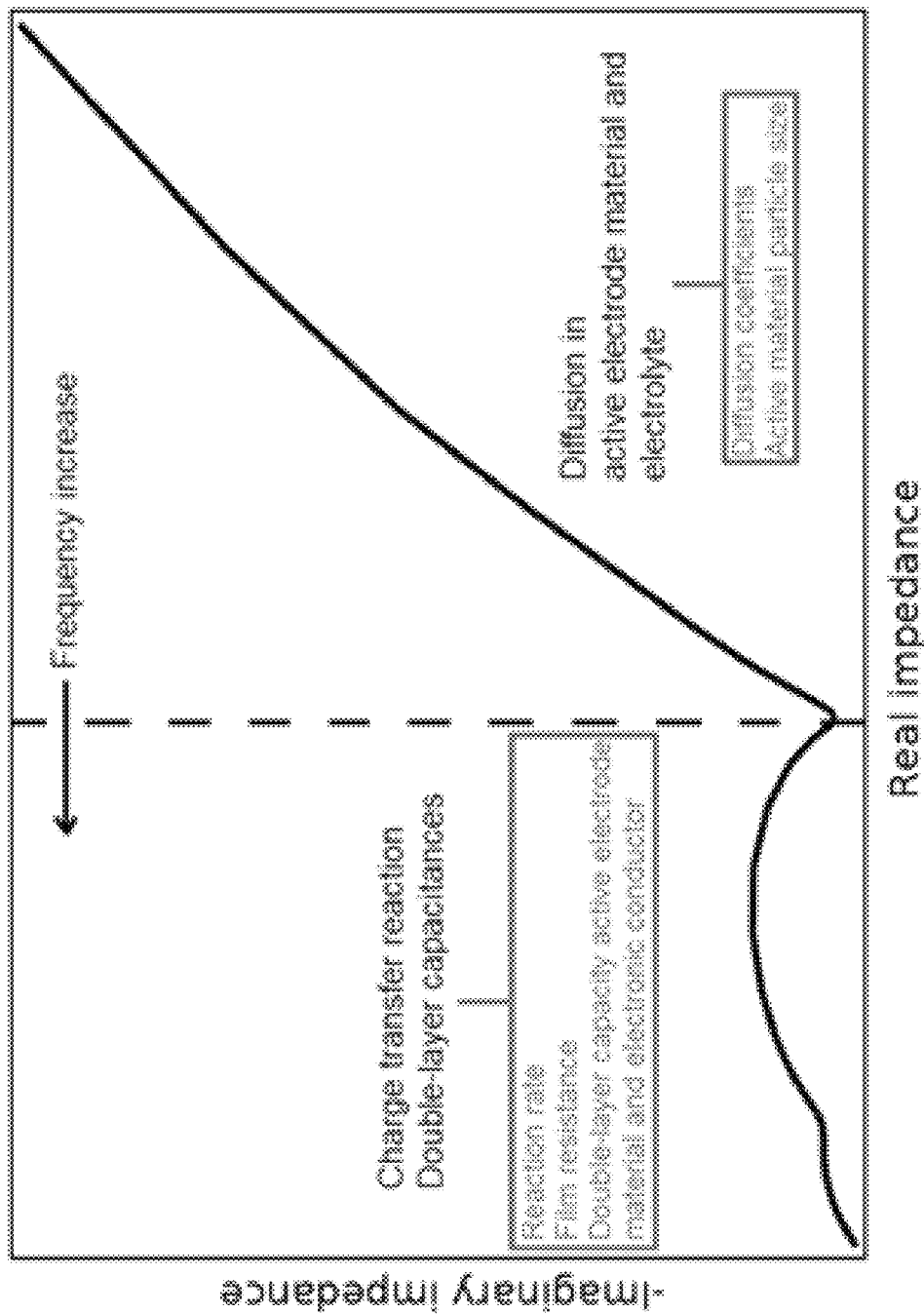
FIG. 6 is a Nyquist plot for electrochemical impedance spectroscopy showing the contributions of various battery phenomena on measured impedance over a range of frequencies.

Data collected over a range of frequencies in electrochemical impedance spectroscopy is commonly presented in a Bode plot or a Nyquist plot; the latter shows the value of the imaginary component of impedance as a function of the real component of impedance. FIG. 6 shows an example Nyquist plot for a lithium ion battery (adapted from Comsol Blog, Tommy Zavalis, July 2015, comsol.com/blogs/studying-impedance-to-analyze-the-li-ion-battery-with-an-app/). As can be seen, the plot includes distinct portions that are associated with the three relevant battery physical-chemical phenomena. The curves in the mid and high-frequency ranges may reflect ion transport in a liquid electrolyte, charging of double layers on the materials within the electrode, and resistances of the electrode materials and resistive films. The mid-frequency curve reflects the rate of a charge transfer reaction. The lower frequencies curve or tail reflects ionic diffusion within the active electrode materials. The location and size of the tail may be controlled by the diffusion constants and the particle size for the electrode material. Each such zone reflects physical and material properties underlying the relevant physical-chemical phenomena. As a battery ages or otherwise changes, the impedance information in one or more of these regimes correspondingly changes.

The impedance measurements can be used with a battery model to characterize the battery phenomena. In certain embodiments, one may vary model parameters to determine what features of a battery affect the impedance at a particular frequency or particular frequencies. Alternatively, one can fit the model to experimental impedance data through an optimization procedure and examine the properties.

In certain embodiments, a battery system is designed or configured to conduct EIS in situ, i.e., while the battery is installed in a device such as a consumer electronics device (phone, camera, etc.) or a vehicle (e.g., a car, truck, airplane, boat, or motorcycle). In certain embodiments, the system conducts EIS at times when battery is being charged and/or is not being used (e.g., when the battery is not being discharged; typically when an end user is not using the device). The system may conduct EIS by applying current pulses at different frequencies and measuring the resulting terminal voltage amplitude and phase. It may scan an entire spectrum of frequencies, from mHz to kHz, or a subset. In some implementations, the system applies voltage pulses and measures the battery's current response (at one or both of the battery's terminals). The battery system may be designed or configured to conduct EIS in a way that captures information spanning a range of battery conditions: e.g., the system conducts EIS at different states of charge, different temperatures, etc.

The system may be configured to analyze EIS results (e.g., magnitude and phase of voltage) as a function of at least the applied current frequency and magnitude. It may also analyze these results in terms of one or more of the following battery parameters: temperature, state of charge, and health or age (e.g., number of charge cycles, days in service, etc.). From the EIS results, the system may determine whether a battery is behaving (a) as expected for a normal battery of similar age, (b) in a way suggesting a premature degradation or failure risk, or (c) in a way that poses a safety risk. For example, a measurement of the ionic diffusion in an electrode at a particular SOC and/or temperature is reflective of the integrity of the electrode material and battery design. Mechanical stress in the electrode or fracture of the electrode material grains may lead to slower detected diffusion as observed from low frequency information. Similarly, thickening of the solid-electrolyte-interface (SEI) layer may be reflected in slower detected diffusion as well as worsening surface properties measured as observed from mid frequency information. If the battery is behaving as expected, the system may consider adapting the charging protocol to permit faster charging. If the battery is behaving in a way suggesting that it might fail prematurely, the system may send an alert to the user and/or the manufacture. If such alert is sent, it might trigger a warranty clause for the device and/or battery, and/or it might suggest early replacement of the battery. Alternatively or in addition, if the battery is behaving in a way suggesting that it might fail prematurely, the system may adapt the charging protocol to extend the battery life. If the battery is behaving in a way that poses a safety risk, the system might shut down the device and send a warning to immediately replace the battery or device or take some other precaution. A safety risk might arise if the system detects significant plating of lithium, a high temperature excursion, significant electrolyte degradation, or the like.

Figure 7A:
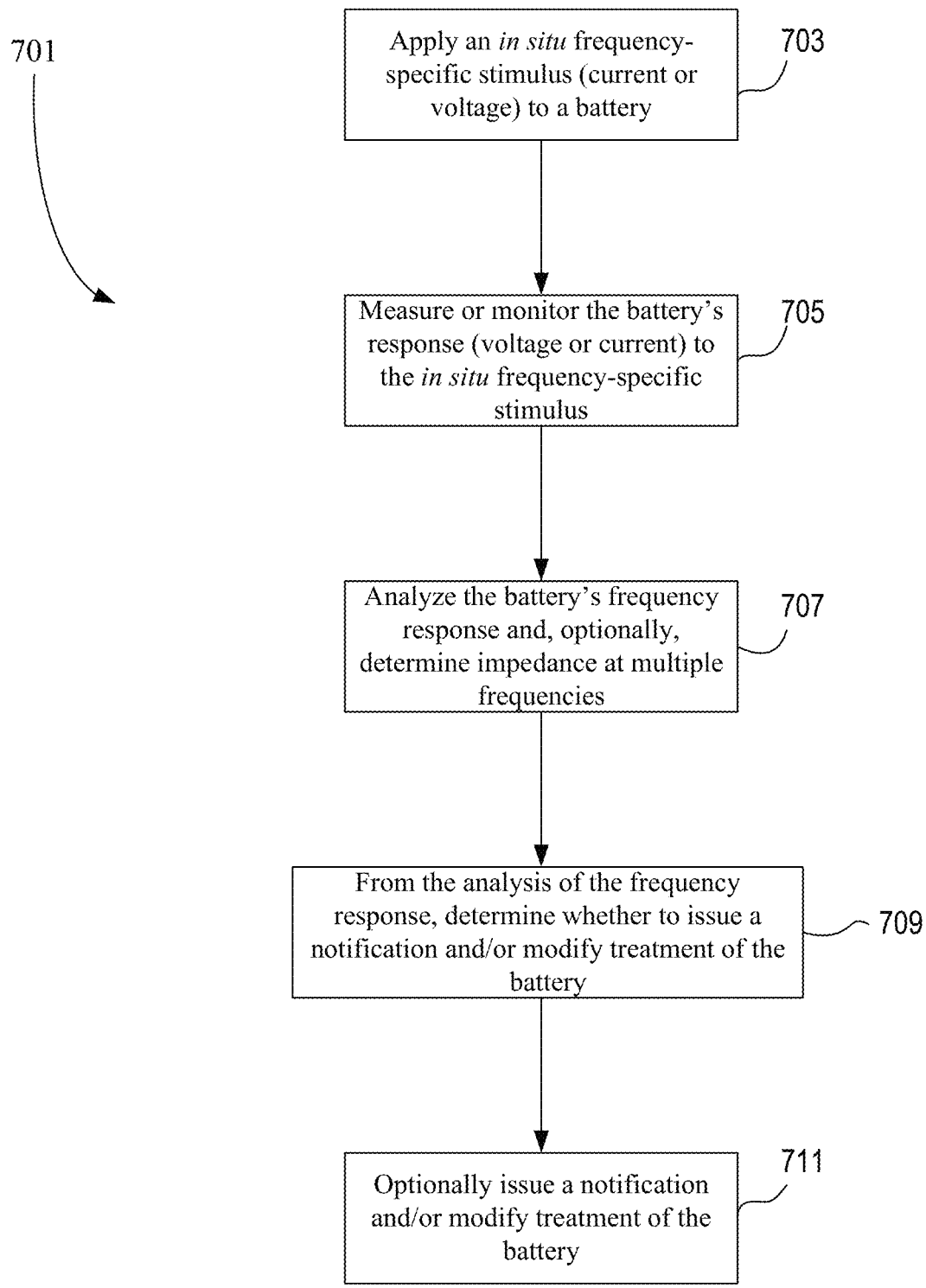
FIG. 7a presents an example process flow for implementing an in situ frequency domain analysis of a battery.

FIG. 7a presents an example process flow for implementing an in situ frequency domain analysis of a battery. In the depicted embodiment, one or more stimulus frequencies are applied to a battery and the battery's response is measured at the one or more frequencies. The resulting information is analyzed to provide frequency-specific impedance data that may be used to ascertain one or more physical phenomena in the battery (e.g., ion transport and/or interfacial reactions). The frequency-specific impedance information may be used as feedback for an adaptive charging procedure and/or for issuing notifications, warning, or taking actions to avoid or mitigate potential safety issues.

As shown in FIG. 7a, a process 701 begins with an operation 703 involving applying an in situ frequency-specific stimulus (e.g., a defined current or voltage) to a battery. Examples of frequency-specific stimuli are described elsewhere herein. For instance, an oscillating current signal may be scanned over a range of frequencies. In some implementations, the stimulus is provided as a range or one or more discrete frequencies within the range of about 1 mHz to 5 kHz. While the battery is exposed to the frequency-specific stimulus, its frequency-specific response is measured or monitored in situ. See operation 705. Examples of frequency-specific measurements are described elsewhere herein. Often the measurements determine the amplitude of the response and the phase of the response with respect to the applied stimulus. For example, the phase and amplitude of a battery's voltage may be measured in response to an oscillating current stimulus.

With data from both the stimulus and response, the process may analyze the battery's frequency response and, optionally, determine impedance at multiple frequencies. See operation 707. Thus, in some cases, the process determines an impedance spectrum of the battery. Of course, the real and imaginary parts of impedance and/or the associated amplitude and phase of impedance may be considered. Such information may be determined and/or used in the same manner as EIS data. For example, as explained, the impedance data may be used to ascertain physical conditions within a battery such as transport and reaction phenomena. The stimulus may be either current or voltage, with the corresponding responses being voltage or current.

From the analysis of the frequency response, the process may determine whether to issue a notification and/or modify treatment of the battery. See operation 709. If the process determines that it should issue such notification or modify such treatment, it may issue an appropriate notification and/or modify treatment of the battery (e.g., modify a charge process). See operation 711. As indicated, modifying the treatment may entail an adaptive charging operation.

As illustrated in FIG. 7a, the stimulus of the battery may take place "in situ," which indicates that the operation takes place while the battery is in a device that it powers. For example, the operation may take place while the battery is being charged, discharged, or sitting idle in the device. Note, however, the processes described herein are not limited to in situ processes; in some cases, the process is performed with the battery removed from its device.

The frequency of a stimulus that affects a particular type of battery's physical and/or chemical phenomenon corresponds to the reciprocal of a time constant for the phenomenon. Thus, while battery information used in embodiments of this disclosure may be obtained by frequency domain stimulus and frequency domain analysis in the same manner as EIS, similar information may be captured in the time domain and converted to the frequency domain through, e.g., a Fourier Transform. Analysis of the resulting data may be conducted in the frequency domain as is conventional in electrochemical impedance spectroscopy. For example, rather than applying current pulses at various frequencies, a battery system may apply discrete current pulses (e.g., charge and discharge pulses) and measure voltage at various times after the current pulse(s). The current pulse(s) and resulting voltage variations can be decomposed into its various frequency (or harmonic) components that constitute the pulse(s). With this information, and the voltage response at various times after the pulse, the system can determine the battery characteristics associated with stimuli at different frequencies.

In some embodiments, an EIS-like analysis is implemented entirely in the time domain, by applying simple current variations such as pulses (of one or both polarities and without a frequency scan) and collecting voltage, and optionally temperature, responses in the time domain (at various times after application of a current pulse). In this manner, the system can perform all calculations in the time domain, without ever transitioning to the frequency domain. The timescale of particular data obtained in the time domain corresponds to the inverse values of particular frequencies, which correlate with different classes of battery physical phenomena as discussed above. When conducting battery analyses in the time domain, an edge of an applied current signal, which edge might or might not begin or end at 0 Amps, serves as a stimulus that allows measurement of response voltage across the battery terminals at various times after the edge is applied, with those various times corresponding to various frequencies.

Figure 7B:
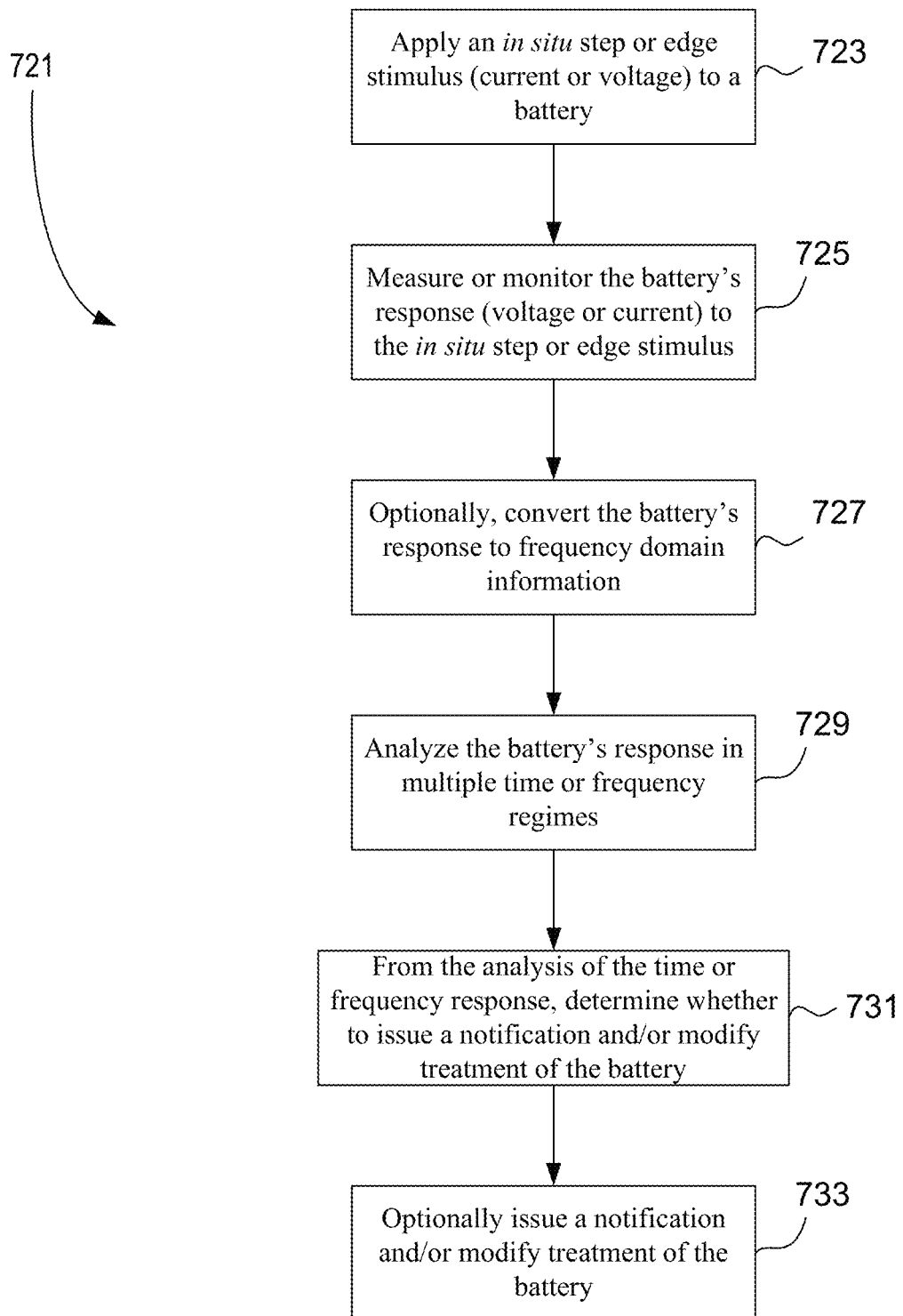
FIG. 7b presents an example process flow for implementing an in situ time domain analysis, at least partially, of a battery.

FIG. 7b presents an example process flow for implementing an in situ time domain analysis, at least partially, of a battery. Thus, unlike the embodiment of FIG. 7a, the process need not scan the stimulus across a range of frequencies, need not apply the stimulus a plurality of discrete frequencies, and/or need not measure a phase a response with respect to the stimulus. However, the resulting information may be analyzed to provide frequency-specific data that may be used to ascertain one or more physical phenomena in the battery (e.g., ion transport and/or interfacial reactions). In some cases, battery impedance values are provided from the time-domain information. As with the frequency domain processes, the resulting information may be used as feedback for an adaptive charging procedure and/or for issuing notifications, warning, or taking actions to avoid or mitigate potential safety issues.

As shown in FIG. 7b, a process 731 begins with an operation 733 involving applying an in situ edge (e.g., a defined current or voltage pulse) to a battery. Depending on step size, slew rate, pulse width, and/or other characteristics of the edge, various pieces of information corresponding to various frequencies, and hence various physical processes within the battery, may be elucidated. As with the process of FIG. 7a, the process measures and/or monitors the battery's response (voltage or current) to the in situ step or edge stimulus. See operation 725. As explained more fully elsewhere herein, the measurement may be taken at various times after application of the edge or other time domain stimulus. The total duration of the measurement along with the sampling frequency and the magnitude(s) of the measured response provide information corresponding to various frequency-dependent impedances and hence various physical processes in the battery. Thus, a time-domain process such as that of FIG. 7b need not convert measurements to the frequency domain or otherwise perform frequency-domain analyses. However, in certain embodiments, a process employing time-domain measurements converts the battery's response to frequency-domain information to provide frequency-domain analysis. See optional operation 727.

Regardless of whether time-domain or frequency-domain analysis is performed, the process may characterize the battery in terms of one or more of its internal physical processes (e.g., transport or reaction phenomena). In some cases, as depicted in operation 729 of FIG. 7b, the process analyzes the battery's response in multiple time or frequency regimes. This allows the process to consider various possible issues that may impact a battery's performance of safety. In certain embodiments, a time-domain battery analysis process considers the battery's performance at one or more time points within the range of about 0.001 to 1000 seconds.

From the analysis of the time or frequency response, the process may determine whether to issue a notification and/or modify treatment of the battery. See operation 731. If the process determines that it should issue such notification or modify such treatment, it may issue an appropriate notification and/or modify treatment of the battery (e.g., modify a charge process). See operation 733. As indicated, modifying the treatment may entail an adaptive charging operation.

a. Examples of Time Domain Stimulus and/or Time Domain Measurement b. Stimulus

Various types of stimulus may be applied to the battery. A stimulus time-domain signal may use a charging signal or a discharging signal. If a charging stimulus is used, then the change in voltage in the time domain is positive. If a discharging signal or pulse is used, then the change in voltage in the time domain is negative. The current stimulus may be a single edge (e.g., a step), a pulse, or other shape. The duration and slew rate of the edge define the maximum bandwidth of harmonic frequencies that will stimulate the battery's response. For example, a pulse of duration T has spectral energy at the main frequency component ½T and harmonic multiples at n×½T where n=2, 3, 4, etc.

a. Response

Various types of signals produced by the battery in response to a stimulus may be monitored or detected to provide information about characteristics of the battery. For example, voltage and/or current responses may be measured at one or more times after the stimulus is applied.

In certain embodiments, voltage response to the stimulus is measured at different time durations during and after the stimulus. The duration at which the voltage measurement is made is inversely proportional to the desired frequency or harmonic of the stimulus. A measurement duration that extends over a longer time is a measurement response that includes multiple frequency components, and is a linear superposition of the values over the desired spectral range. This equivalence of time and frequency domains is well understood by those of skill in the art. It is described in textbooks on Fourier transforms such as "The Fourier Transform and its Application", $2^{nd}$ edition, by Ronald Bracewell, published by McGraw-Hill, incorporated herein by reference in its entirety.

In one example, a CPV measurement made over a duration of 1 second contains a spectral information equivalent to 1 Hz, and corresponds to the zone in the EIS chart that reflects ionic diffusion in solid electrode material or in solid state electrolytes. Similarly, a partial relaxation measurement made over a duration of a few to hundreds of milliseconds contains spectral information equivalent to tens to thousands of Hz, and corresponds to the zone in an EIS chart that reflect surface charge layer(s), charge kinetics and conductor properties.

The voltage measurement may be a measurement between two points, a first starting point when the stimulus is applied, and second end point later. The spectral content is inversely proportional to the duration between the two points. The spectral content is also influenced by the sampling rate. The voltage measurement may include M samples between these two points, in which case the spectral content is increased by a factor of M/2. The desired sampling rate (and inherent spectral content) depend on many chemical-physical processes are targeted for diagnosis.

a. Comparison of Response and Stimulus Signals

Measuring the voltage response and its corresponding time constant provides a quantitative measurement of the chemical-physical processes that take place at high frequency, e.g., film resistance or double-layer characteristics (see FIG. 6). Various approaches may be employed to generate and interpret response data. A system may be designed or configured to control parameters such as the magnitude of the applied stimulus, the durations of the stimulus and response, and the number of measurements or samples taken over these durations.

The voltage measurement may be characterized by three sets of values: the voltage amplitude at each sample point, the duration of the measurement period, and the number of samples taken over this period. Correspondingly, the stimulus current may also be measured and characterized by three sets of values: the current amplitude at each sample point, the duration of the measurement period, and the number of samples taken over this period. The number of samples is inversely proportional to the maximum spectral content. The voltage and current values at each sample point are related to the complex impedance value at a particular frequency, said sampling frequency is inversely proportional to the sampling period. The voltage and current values at the end of the measurement period are related to the complex impedance value at another lower sampling frequency, with the frequency being inversely proportional to the longer measurement period. The difference between the upper and lower frequencies is the bandwidth itself, related to the overall measurement period. Those of skill in the art understand the relationship between sampling times, sampling frequencies and bandwidth, which is commonly used in communications theory. Consequently, such a measurement technique conducted in time domain provides quantitative analysis of the impedance at different frequency zones on the EIS chart without the application of frequency signals or the use of computationally intensive frequency transforms. Frequently, implementation of time-domain measurements is more practical than the implementation of frequency-domain measurements.

The stimulus current may be a discharge pulse of short duration, implying a high frequency stimulus for the battery. A discharge pulse of such short duration has very little impact, if any, on depleting charge from the battery.

Figure 7C:
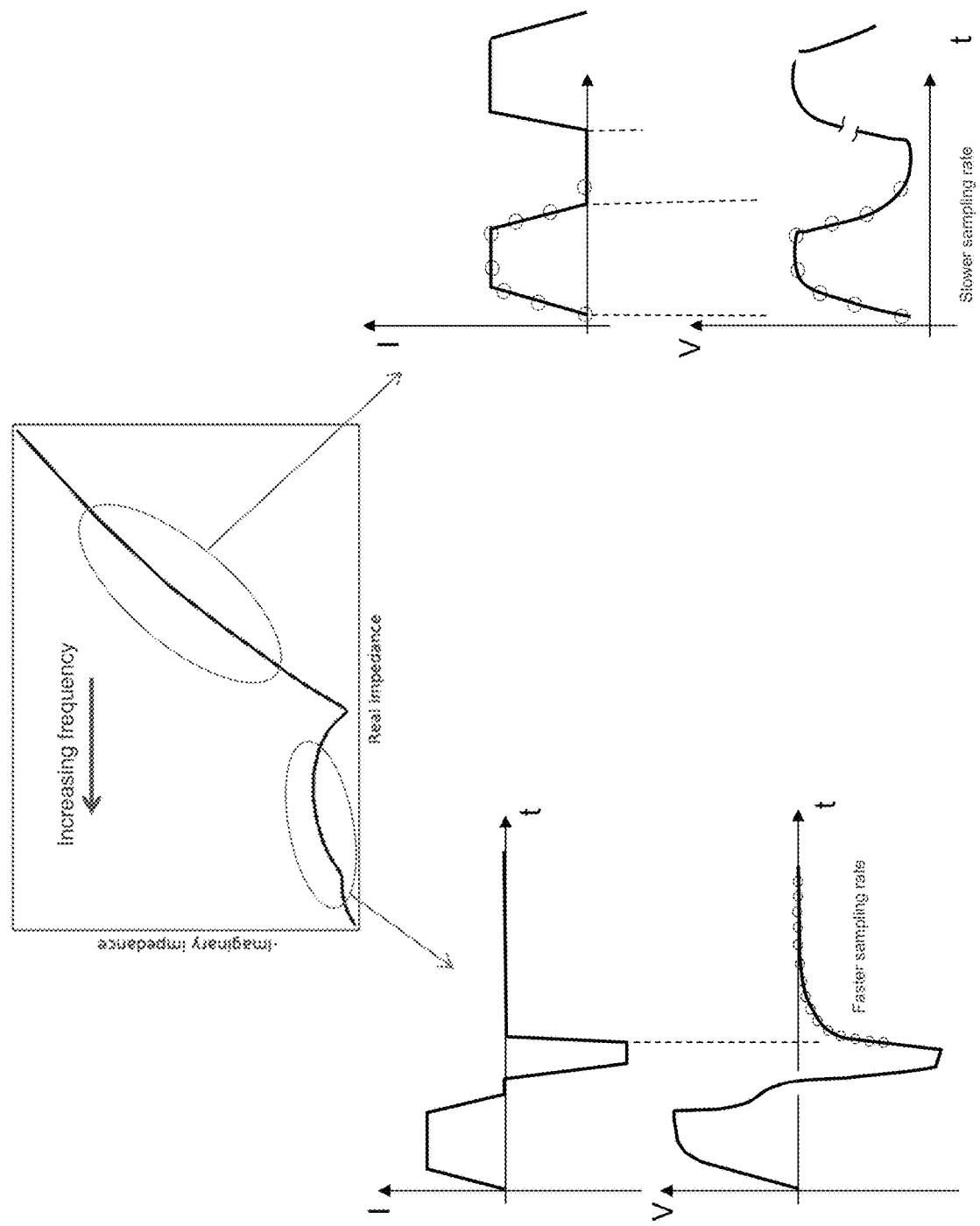
FIG. 7c illustrates time domain acquisition of electrochemical data and corresponding frequency domain information as illustrated using a Nyquist plot.

FIG. 7c illustrates examples of time domain acquisition of electrochemical data and associated frequency domain locations on a Nyquist plot. The figure shows how different charging current stimuli and voltage measurements associated with different time domains correspond to different battery phenomena.

In a first example, a current-voltage plot for a high frequency (small time constant) battery probing technique is depicted in the lower left portion of the figure. As shown, a negative pulse with a steep edge along with a high sampling rate produces data indicative of high frequency battery phenomena such as diffusion of ions in electrolyte. This is information associated with lower values of the real component of impedance as illustrated in the corresponding Nyquist plot shown on the upper portion of the drawing.

In a second example, a current-voltage plot for a lower frequency (large time constant) battery probing technique is depicted in the lower right portion of the figure. As shown, a positive charging pulse with a shallow edge (low slew rate) along with a low sampling rate produces data indicative of low frequency battery phenomena such as diffusion of ions in a solid-phase electrode. This is information associated with higher values of the real and imaginary components of impedance as illustrated in the corresponding Nyquist plot.

a. Remediation Operations Such as Adjustments to the Charging Process

The quantitative analysis of the impedance at different zones of the EIS chart may be used as a direct mechanism to diagnose changes in the battery's characteristics. In particular, changes in values measured from cycle to cycle at a given SOC offer a particularly targeted diagnosis of one or more physical properties of the battery and its materials. For example, a change in the CPV value from cycle to cycle may be indicative of degradation in one of the underlying battery physical/chemical processes and may be representative of the onset of internal damage to the electrode materials or the presence of metal plating. Such targeted diagnostic information may be used to modify the amplitude of the charging current in a closed loop system to address the degraded health of the battery.

Apparatus

The apparatus used to generate time and/or frequency domain battery data and/or analyze a battery's condition using such data may have many configurations. In some cases, all or most of the measured battery data (e.g., current, voltage, and temperature) is collected by a single module or circuit, while in other cases, the battery data is collected by multiple modules and/or circuits. Battery monitoring circuits and/or charging circuits may be used for this purpose. In some cases, the battery control logic, whether operating alone or in conjunction with battery monitoring and/or charging circuitry, may be used to collect the battery data. In certain embodiments, the battery data is collected by a module, circuit, or logic that is directly connected to a battery such as a circuit or a module that is physically attached to, mounted on, or encased in an electronic device housing the battery. In other embodiments, the battery data is collected by a module, circuit, or logic that is distant from the battery and/or the electronic device powered by the battery. For example, the module, circuit, or logic may be coupled to the battery and/or device by a wired or wireless link.

The apparatus that operates the battery control logic may be the same apparatus used to collect the battery data or may be a distinct apparatus such as a mobile device, a server, or a distributed collection of remote processing devices. In some implementations, a cloud-based application is used to store and operate the battery control logic. In certain embodiments, the apparatus used to collect battery data is also used to adaptively charge a battery.

FIG. 1 depicts in block form a battery monitoring/charging system that may be configured to obtain and analyze time and/or frequency domain data from a battery, and, optionally, adaptively charge a battery. The apparatus includes charging circuitry 112 that responds to control signals to generate a charge signal that is applied to the terminals of the battery. The apparatus also includes measurement circuitry 114 coupled to the battery, to measure voltage, current, and/or other battery parameter values that may be used for adaptive charging. Control circuitry 116 is coupled to the charging circuitry and the measuring circuitry. Using data received by the monitoring circuitry the control circuitry is configured to generate one or more control signals to adapt one or more characteristics of a charge packet in the context of adaptive charging. In some cases, the control circuitry may also play roles in monitoring battery performance and collecting battery parameter values.

a. Charge Circuitry

In one embodiment, charging circuitry 112 is designed and/or configured to apply one or more charge signals to the battery in response to control circuitry. The charging circuitry may include a current source and/or a voltage source to apply electrical charge to the terminals of the battery 118. The charge signals applied by the charging circuitry may include one or more charging signals which provide a net input of charge or current into the battery (see, for example, FIGS. 3*a* and 3*b*) and one or more discharging signals which provide a net removal of charge or current from the battery (see, for example, FIGS. 3*c* and 3*d*).

The adaptive charging circuitry and techniques may employ any charging circuitry, whether described herein, now known or later developed, to charge the battery; all such charging circuitry are intended to fall within the scope of this disclosure. For example, charging circuitry may generate charge and discharge signals, packets, and pulses (as described herein). Notably, charging circuitry is generally responsive to control signals from the control circuitry.

As explained above with reference to FIGS. 4*a*-4*g*, the charge and discharge signals may include a plurality of charge packets where each charge packet includes one or more charge pulses and, in certain embodiments, one or more discharge pulses. The charge and discharge signals may also include one or more discharge packets where each discharge charge packet includes one or more discharge pulses. Indeed, the charge and discharge signals may also include charge packets and one or more discharge packets where each charge packet and discharge packet include one or more charge pulses and/or one or more discharge pulses.

In certain embodiments, the charge circuitry is designed or configured to apply oscillating current and/or voltage signals to the battery. Such oscillating signals may be provided at a fixed frequency, a plurality of discrete frequencies, or a continuum of frequencies. As explained elsewhere herein various frequencies stimulate distinct physical phenomena within a battery. In certain embodiments, the charge circuitry is designed and/or configured to programmably vary the frequency of applied current signals to the battery.

a. Monitoring Circuitry

Monitoring circuitry 114 is designed and/or configured to measure, monitor, sense, detect and/or sample, on a continuous or periodic basis (e.g., at predetermined states of charged) one or more conditions or characteristics of the battery. For example, the monitoring circuitry may measure the terminal voltage (an open circuit voltage (OCV) or a closed circuit voltage (CCV)), the voltage response of the battery to one or more charge pulses, oscillating current of varying frequencies, and/or temperature of the battery. In one embodiment, the monitoring circuitry includes a sensor to determine a voltage (for example, a voltmeter) and/or a sensor to determine a current (for example, a current meter). The monitoring circuitry provides data which is representative of the condition or characteristics of the battery to the control circuitry. Moreover, the monitoring circuitry may include one or more temperature sensors which are thermally coupled to the battery to generate, measure, and/or provide data which is representative of the temperature of the battery. The monitoring circuitry and techniques may be those described herein, now known or later developed, to acquire data employed by the control circuitry to adapt the charging profile of the battery; all such monitoring circuitry and techniques are intended to fall within the scope of this disclosure.

a. Control Circuitry

In certain embodiments, the control circuitry 116 is designed and/or configured to use data from monitoring circuitry to calculate, determine and/or assess the state or condition of the battery in connection with the charging or recharging process. For example, control circuitry may calculate, determine and/or estimate a change in terminal voltage of the battery in response to charge or current applied to or injected into the battery. The control circuitry may also calculate, determine and/or estimate one, some, or all of the SOC of the battery, SOH of the battery, partial relaxation time of the battery, overpotential of the battery, and/or full relaxation time of the battery. The control circuitry may also calculate, determine and/or estimate one or more physical characteristics of the battery or one or more battery parameters associated with the physical characteristics. As explained, examples of battery physical characteristics include diffusion of ions in the battery's electrolyte, diffusion of ions in one of the battery's electrodes, reactions at the battery's anode, etc. Examples of parameters associated with such physical characteristics include diffusion coefficients, reaction rate constants (or any order reaction), etc.

The control circuitry may also calculate, determine, and/or implement a charging sequence or charging profile based on or using one or more of the adaptive charging techniques and algorithms. For example, the control circuitry may be configured to implement any of the charge or discharge adjustments described herein to address actual or potential degradation of the battery. In this regard, control circuitry adapts, adjusts and/or controls one or more characteristics of the charge or current applied to or injected into the battery (via controlling the operation of charging circuitry) so that the terminal voltage, the change in terminal voltage, or another battery parameter (in response to charge or current applied to or injected into the battery during a charging or recharging sequence/operation) is within a predetermined range and/or below a predetermined value. In this regard, one or more characteristics of the charge signal may be adapted to control and/or manage battery parameters such as the terminal voltage or a relaxation time. In addition to adapting the sequence of charge signals, discharge signals and rest periods—in relation to each other—the control circuitry may vary, adjust and/or control one or more of the variable characteristics of a charge signal. In some cases, the control circuitry may configured to obtain or provide a desired or predetermined relaxation time or period (for example, a relaxation time that is within prescribed range), by adjusting and/or controlling the amount of electrical charge removed during a discharge period, the amount of electrical charge added during a charge period, and/or the characteristics of a rest period. In one embodiment, the adaptive charging technique or algorithm employs a sequence of discharge signals where the relaxation time is calculated, determined and/or measured after each of the discharge signals. In this way, the control circuitry may adaptively determine the total amount of electrical charge that should be removed (and, in response thereto, control the charging circuitry accordingly).

Control circuitry may include one or more processors, one or more state machines, one or more gate arrays, programmable gate arrays and/or field programmable gate arrays, and/or a combination thereof. Indeed, control circuitry and monitoring circuitry may share circuitry with each other as well as with other elements; such circuitry may be distributed among a plurality of integrated circuits which may also perform one or more other operations, which may be separate and distinct from that described herein. In some embodiments, control circuitry may be housed within a device containing the battery. Alternatively, a battery may be housed in an electronic device, while control circuitry may be housed elsewhere. For example, control circuitry may operate on a remote server or a cloud-based application. In some cases, control circuitry may be coupled to monitoring circuitry and/or charging circuitry via wireless or wired communication. In some cases, control circuitry may be configured to store identified parameter values on a remote server, and in some cases, control circuitry algorithms may be updated by a user.

Control circuitry may perform or execute one or more applications, routines, programs and/or data structures that implement particular methods, techniques, tasks or operations described and illustrated herein. The functionality of the applications, routines or programs may be combined or distributed. In addition, the applications, routines or programs may be implemented by control circuitry using any programming language whether now known or later developed, including, for example, assembly, FORTRAN, C, C++, and BASIC, whether compiled or uncompiled code; all of which are intended to fall within the scope of the present disclosure.

ADDITIONAL EMBODIMENTS

It should be noted that the circuitry of the present disclosure may include and/or employ the control/processing circuitry, monitoring circuitry and/or charging circuitry described and illustrated in PCT Application Serial No. PCT/US2012/30618, U.S. application Ser. No. 13/366,352, U.S. application Ser. No. 13/626,605, U.S. application Ser. No. 13/657,841, U.S. application Ser. No. 13/747,914, all of which are incorporated herein by reference in their entireties. For the sake of brevity, the discussion regarding such circuitry, in the context of the techniques of the present disclosure, will not be repeated.

The memory which stores the data, equations, relationships, instructions for executing battery models, and/or look-up table may be a permanent, semi-permanent or temporary (i.e., until re-programmed) storage that is discrete or resident on (i.e., integrated into), for example, the control circuitry. As such, in one embodiment, the memory may be one time programmable, or data, equations, relationships, and/or look-up table employed by the control/processing circuitry may be one time programmable (for example, programmed during a test or at manufacture). In another embodiment, the memory is more than one time programmable and, as such, the predetermined values and/or band limits employed by the control circuitry may be modified after test and/or manufacture. For example, predetermined values and/or band limits may be modified by the control logic or by a firmware update. In certain embodiments, the memory is non-transitory memory.

In some embodiments, memory for storing data, equations, executable instructions, relationships, and/or battery parameter values may be located on a battery unit. By having memory physically attached to a battery itself, it is possible to capture and record a battery's parameters even when the battery is used between multiple devices. For example, a battery enclosure may have memory that is permanently attached or memory that is detachable. In some cases physically attached memory may be configured to communicate with the device the battery is attached to via wireless communication, e.g., a battery may have an RFID with memory. In some cases, a battery may be configured with connection pins that may be used to transfer information to the device to which a battery is attached.

Many modifications, variations, combinations and/or permutations are possible in light of the above teaching. For example, although the exemplary embodiments and/or techniques are described and/or illustrated in the context of methods and circuitry for and techniques for a lithium-ion technology/chemistry based battery/cell (for example, lithium-cobalt oxide, lithium-manganese oxide, lithium-iron phosphate, and lithium-iron sulfide), the concepts described and/or illustrated herein may also be implemented in conjunction with other electrolyte battery/cell chemistries/technologies having anode(s) comprised of aqueous or non-aqueous electrolytes, and various anode and cathode materials. Examples of anode materials include lithium metal (e.g., lithium metal foil), silicon or silicon alloys, and one more other materials including, for example, other silicon-carbon composite materials, tin alloys, and composite tin-graphite. Electrolytes may be liquid, gel, or solid phase electrolytes. Batteries unrelated to lithium ion batteries or even intercalation batteries may be useful in the context of this disclosure. Examples include nickel metal hydride batteries, nickel zinc batteries, lithium metal batteries (e.g., lithium-sulfur batteries), and various types of solid-state batteries. Thus, it is to be understood that other embodiments may be utilized and operational changes may be made without departing from the scope of the present disclosure. As such, the foregoing description of the exemplary embodiments has been presented for the purposes of illustration and description. It is intended that the scope of the disclosure not be limited solely to the description above.

It should be further noted that the various circuits and circuitry disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media). Examples of transfers of such formatted data and/or instructions include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations using computer aided design and/or testing tools. The simulation of the charging circuitry, control circuitry and/or monitoring circuitry, and/or techniques implemented thereby, may be implemented by a computer system where characteristics and operations of such circuitry, and techniques implemented thereby, are imitated, replicated and/or predicted via a computer system. The present disclosure is also directed to such simulations of the disclosed charging circuitry, control circuitry and/or monitoring circuitry, and/ or techniques implemented thereby, and, as such, are intended to fall within the scope of the present disclosure. The computer-readable media corresponding to such simulations and/or testing tools are also intended to fall within the scope of the present disclosure.

Notably, reference herein to "one embodiment" or "an embodiment" means that a particular feature, structure, or characteristic described in connection with the embodiment can be included in one some or all of the embodiments of the present disclosure. The usages or appearances of the phrase "in one embodiment" or "in another embodiment" in the specification are not referring to the same embodiment, nor are separate or alternative embodiments necessarily mutually exclusive of one or more other embodiments. The same applies to the term "implementation." The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein.

Further, an embodiment or implementation described herein as exemplary is not to be construed as preferred or advantageous, for example, over other embodiments or implementations; rather, it is intended to convey or indicate that the embodiment or the embodiments are example embodiment(s).

In the claims, the term "determine" and "calculate" and other forms thereof (i.e., determining, determined and the like or calculating, calculated and the like) means, among other things, calculate, assesses, determine and/or estimate and other forms thereof.

Moreover, the phrase "determining a state of charge of the battery" and "calculating a state of charge of the battery" in the claims means determining, detecting, calculating, estimating, and/or measuring a state of charge of the battery and/or a change in a state of charge of the battery/cell. Similarly, the phrase "calculating a state of health of the battery" and "determining a state of health of the battery" in the claims means determining, detecting, calculating, estimating, and/or measuring a state of health of the battery and/or a change in a state of health of the battery/cell.

In addition, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. Further, the term "data" may mean, among other things, a current or voltage signal(s) whether in analog or a digital form (which may be a single bit (or the like) or multiple bits (or the like)).

As used in the claims, the terms "comprises," "comprising," "includes," "including," "have," and "having" or any other variation thereof, are intended to cover a non-exclusive inclusion, such that a process, method, article, or apparatus that comprises a list of elements does not include only those elements but may include other elements not expressly listed or inherent to such process, method, article, or apparatus.

Further, the statement that one or more circuits, circuitry, nodes and/or components are "coupled" means that the circuits, circuitry, nodes and/or components are joined and/ or operate (for example, physically or electrically) together either directly or indirectly, i.e., through one or more intermediate circuits, circuitry, nodes and/or components, so long as a link occurs; "directly coupled" means that two elements are directly joined, in contact and/or operate with each other.

The claim elements that do not recite "means" or "step" are not in "means plus function" or "step plus function" form. (See, 35 USC § 112(f)). Applicant intend that only claim elements reciting "means" or "step" be interpreted under or in accordance with 35 U.S.C. § 112(f).

What is claimed is:

1. A method of classifying and adjusting use of a battery, the method comprising:
    (a) providing one or more values of one or more charge process parameters to a battery model designed or configured to characterize the battery and the one or more charge process parameters;
    (b) receiving from the battery model, a battery charge process characteristic that provides a predicted effect of charging the battery under conditions indicated by the one or more charge process parameters currently applied to or to be applied to the battery; and
    (c) based on the battery charge process characteristic received from the battery model, (i) adjusting a charge process used to charge the battery and/or (ii) terminating use of the battery, at least temporarily.

2. The method of claim 1, wherein the battery model operates on a remote cloud device.

3. The method of claim 2, wherein the charge process is adjusted based on information provided to charging circuitry associated with the battery from the remote cloud device.

4. The method of claim 3, wherein the information is provided via a wireless link.

5. The method of claim 1, wherein the one or more charge process parameters comprise one or more measured parameters comprising at least one of: a temperature of the battery, an open circuit voltage of the battery, a charge passed to the battery during the charge process, or a charge current applied to the battery.

6. The method of claim 1, wherein the one or more charge process parameters comprise one or more derived measurements derived from one or more measured parameters.

7. The method of claim 6, wherein the one or more derived measurements comprise at least one of: a state of charge (SOC) of the battery, a state of health (SOH) of the battery, an available energy capacity of the battery, one or more parameters determined based on the SOH of the battery, an overpotential of the battery, or a partial relaxation time (PRT) of the battery.

8. The method of claim 1, wherein the one or more charge process parameters comprise two or more charge process parameters measured at different times.

9. The method of claim 1, wherein the battery model is designed or configured to provide at least two battery charge process characteristics selected from the group consisting of safe charging, safe but slow charging, potentially unsafe charging, and known unsafe charging.

10. The method of claim 9, wherein adjusting the charge process in (c) comprises determining modified charging parameters that cause the adjusted charge process to operate at a boundary between safe charging and potentially unsafe charging.

11. The method of claim 1, wherein the battery model is trained using electrochemical impedance spectroscopy (EIS) data.

12. The method of claim 1, wherein the battery model takes electrochemical impedance spectroscopy (EIS) data as an input.

13. The method of claim 1, further comprising obtaining the one or more values of the charge process parameters by applying a stimulus to the battery.

14. The method of claim 1, wherein the one or more charge process parameters comprise impedance measurements of the battery.

15. The method of claim 1, further comprising: (i) determining a frequency-specific characteristic of the battery; a spectral profile associated with the battery; or a change associated with the battery; and (ii) measuring an impedance within the battery.

16. The method of claim 15, wherein the battery charge process characteristic is determined based on a range of real and/or imaginary components of the measured impedance within the battery.

17. The method of claim 1, wherein the battery charge process characteristic comprises one or more internal phenomena of the battery.

18. The method of claim 17, wherein the one or more internal phenomena comprise a characteristic of ion transport within the battery and/or a characteristic of an interfacial reaction within the battery.

19. A system for classifying and adjusting use of a battery, the system comprising:
control circuitry configured to:
(a) provide one or more values of one or more charge process parameters to a battery model designed or configured to characterize the battery and the one or more charge process parameters;
(b) receive from the battery model, a battery charge process characteristic that provides a predicted effect of charging the battery under conditions indicated by the one or more charge process parameters currently applied to or to be applied to the battery; and
(c) based on the battery charge process characteristic received from the battery model, (i) adjust a charge process used to charge the battery and/or (ii) terminate use of the battery, at least temporarily.

20. The system of claim 19, wherein the battery model operates on a remote cloud device.

21. The system of claim 20, wherein the charge process is adjusted based on information provided to charging circuitry associated with the battery from the remote cloud device.

22. The system of claim 21, wherein the information is provided via a wireless link.

23. The system of claim 19, wherein the one or more charge process parameters comprise one or more measured parameters comprising at least one of: a temperature of the battery, an open circuit voltage of the battery, a charge passed to the battery during the charge process, or a charge current applied to the battery.

24. The system of claim 19, wherein the one or more charge process parameters comprise one or more derived measurements derived from one or more measured parameters.

25. The system of claim 24, wherein the one or more derived measurements comprise at least one of: a state of charge (SOC) of the battery, a state of health (SOH) of the battery, an available energy capacity of the battery, one or more parameters determined based on the SOH of the battery, an overpotential of the battery, or a partial relaxation time (PRT) of the battery.

26. The system of claim 19, wherein the control circuitry is further configured to obtain the one or more values of the charge process parameters by applying a stimulus to the battery.

27. The system of claim 19, wherein the control circuitry is further configured to: (i) determine a frequency-specific characteristic of the battery; a spectral profile associated with the battery; or a change associated with the battery; and (ii) measure an impedance within the battery.

28. The system of claim 27, wherein the battery charge process characteristic is determined based on a range of real and/or imaginary components of the measured impedance within the battery.

29. The system of claim 19, wherein the battery charge process characteristic comprises one or more internal phenomena of the battery.

30. The system of claim 29, wherein the one or more internal phenomena comprise a characteristic of ion transport within the battery and/or a characteristic of an interfacial reaction within the battery.

* * * * *